US010606052B2

(12) United States Patent
Tsakalakos et al.

(10) Patent No.: US 10,606,052 B2
(45) Date of Patent: Mar. 31, 2020

(54) VEHICLE NAVIGATIONAL SYSTEM

(71) Applicant: General Electric Company, Schenectady, NY (US)

(72) Inventors: Loucas Tsakalakos, Niskayuna, NY (US); Chen-Po Chen, Niskayuna, NY (US); Binoy M. Shah, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 16/601,067

(22) Filed: Oct. 14, 2019

(65) Prior Publication Data

US 2020/0057287 A1 Feb. 20, 2020

Related U.S. Application Data

(63) Continuation-in-part of application No. 15/497,552, filed on Apr. 26, 2017, now Pat. No. 10,443,812.

(60) Provisional application No. 62/348,291, filed on Jun. 10, 2016.

(51) Int. Cl.
*G02B 19/00* (2006.01)
*H01S 5/40* (2006.01)
*G02B 27/09* (2006.01)

(52) U.S. Cl.
CPC ..... *G02B 19/0057* (2013.01); *G02B 19/0014* (2013.01); *G02B 27/0922* (2013.01); *G02B 27/0961* (2013.01); *G02B 27/0966* (2013.01); *H01S 5/4012* (2013.01); *H01S 5/4025* (2013.01)

(58) Field of Classification Search
CPC .... G02B 26/02; G02B 26/105; G02B 27/283; G02B 27/286
USPC ......................................... 362/244, 326, 332
See application file for complete search history.

(56) References Cited

U.S. PATENT DOCUMENTS

| | | | | |
|---|---|---|---|---|
| 6,853,490 B2* | 2/2005 | Wang | ...................... | B41J 2/451 359/621 |
| 8,301,027 B2* | 10/2012 | Shaw | ...................... | G01S 17/88 398/88 |
| 8,526,811 B2* | 9/2013 | Xie | ...................... | H04B 10/564 398/25 |
| 9,170,435 B2* | 10/2015 | Lopez | ...................... | G01S 1/70 |

\* cited by examiner

*Primary Examiner* — William J Carter
(74) *Attorney, Agent, or Firm* — The Small Patent Law Group LLC; Mary D. Lawlor

(57) ABSTRACT

A lighting system for a navigational system of a vehicle includes a scanning unit and one or more lighting assemblies. Each lighting assembly includes one or more laser diodes configured to emit light, a lens array including one or more lens elements, and a controller electrically coupled with each of the laser diodes. The lens array receives incoming light from the laser diodes and direct the incoming light from the lens array as a collimated beam. The controller individually controls a power level of each of the laser diodes. The laser diodes, the lens array, and the controller are disposed on a substrate and disposed in a common housing. Each lighting assembly is arranged in an arc relative to the scanning unit. The scanning unit receives the collimated beam from each lighting assembly and directs the collimated beam from each lighting assembly in two orthogonal directions.

20 Claims, 17 Drawing Sheets

VEHICLE NAVIGATIONAL SYSTEM

CROSS-REFERENCE TO RELATED APPLICATIONS

This application is a Continuation-In-Part of and claims priority to U.S. Pat. No. 10,443,812 filed Apr. 26, 2017, which claims priority to U.S. Provisional Application Ser. No. 62/348,291 filed Jun. 10, 2016. The entire disclosures of which are incorporated herein by reference.

BACKGROUND

Navigating and controlling vehicles, such as an aircraft, is a difficult and complicated process. Whether the aircraft is operated manually by a pilot or operated automatically, such as an unmanned aerial vehicle, operation of the aircraft can be complicated by many factors. Poor weather conditions, such as storms, fog, hail, downdrafts, darkness, and high winds, reduce visibility and impact the performance of the aircraft. Operation of the aircraft can also be affected by the specific geography and surrounding of the location of operation. For example, operating an aircraft in crowded or high-risk environments, such as an emergency response location, a ship, an offshore oil drilling platform, requires precise and accurate control to reduce safety risks, such as collision. This is especially true when the aircraft is performing sophisticated maneuvers such as landing, aerial docking, or aerial refueling.

To increase the safety of aircraft operation, systems have been developed to assist with navigation, control, landing, and aerial refueling. These systems include global positioning systems (GPS), radio navigational systems, inertial navigation systems (INS), non-directional beacons (NBD), optical navigation systems, and laser navigation systems. Laser navigation systems have certain advantages over other types of systems. For instance, laser navigation systems are self-contained, and operate in poor weather conditions and environments where other systems cannot operate.

However, existing laser navigation systems are too large for some applications in particular mobile applications. Typically, navigation beacons for aerial applications use intensity modulated 405 nm laser diodes, or a 1.55 um fiber laser with bulk optics for beam shaping and a two axis galvanometer for beam deflection. These systems tend to be in one or two large boxes to contain the laser sources and a separate unit for the bulk optics and control electronics.

In addition, the laser power generated is too low to transmit navigation information to the desired distances, such as 6,000 feet or more. Generally, existing systems cannot generate a tight enough formed beam to achieve signal levels on the outer periphery of the pattern.

Also, the optics in existing systems are not capable of maintaining proper performance over long distances, which reduces the operational range of the system. Typically, the beam forming optics are incapable of maintaining the correct shape over long propagation distances, especially for the widely divergent sections of the beam. If the beam is aberrated or distorted, the signal intensity that the incoming aircraft receives is reduced, which degrades the SNR, and reduces the range over which the system can operate.

BRIEF DESCRIPTION

In accordance with one embodiment, a lighting system for a navigational system of a vehicle includes a scanning unit and one or more lighting assemblies. Each of the one or more lighting assemblies includes one or more laser diodes configured to emit light, a lens array including one or more lens elements, and a controller electrically coupled with each of the one or more laser diodes. The lens array is configured to receive incoming light from the one or more laser diodes and direct the incoming light from the lens array as a collimated beam. The controller is configured to individually control a power level of each of the one or more laser diodes. The one or more laser diodes, the lens array, and the controller are disposed on a substrate and disposed in a common housing. Each of the one or more lighting assemblies is arranged in an arc relative to the scanning unit. The scanning unit receives the collimated beam from each of the one or more lighting assemblies and directs the collimated beam from each of the one or more lighting assemblies in two orthogonal directions.

In according with one embodiment, a lighting system includes a laser diode array including one or more laser diodes, a lens array including one or more lens elements, a controller electrically coupled with each of the one or more laser diodes of the laser array, and a cooling device configured to manage a temperature of the lighting assembly. The one or more laser diodes are configured to emit light. Each of the one or more laser diodes is optically connected to the one or more lens elements. The lens array is configured to receive incoming light from the one or more laser diodes. The lens array is configured to direct outgoing light as a collimated beam. The controller is configured to individually control a power level of each of the one or more laser diodes. The laser diode array, the lens array, and the controller are disposed on a first side of a substrate and disposed in a common housing. The cooling device is disposed on an alternative side of the substrate and in the common housing.

BRIEF DESCRIPTION OF THE DRAWINGS

The present inventive subject matter will be better understood from reading the following description of non-limiting embodiments, with reference to the attached drawings, wherein below.

DETAILED DESCRIPTION

Figure 1:
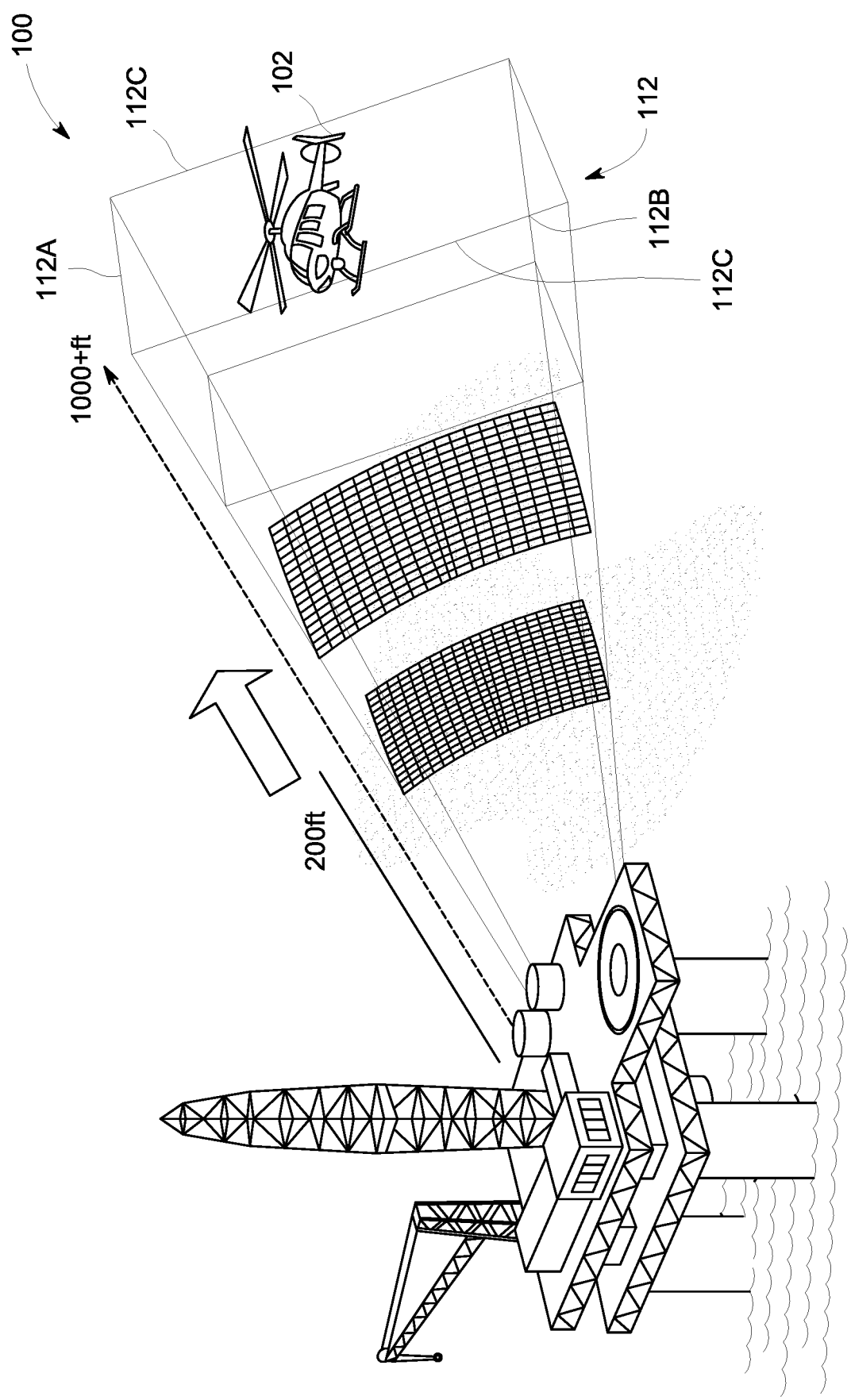
FIG. 1 illustrates one example of a navigational system guiding a vehicle according to an embodiment.

The following detailed description illustrates the inventive subject matter by way of example and not by way of limitation. The description enables one of ordinary skill in the art to make and use the inventive subject matter, describes several embodiments of the inventive subject matter, as well as adaptations, variations, alternatives, and uses of the inventive subject matter. Additionally, it is to be understood that the inventive subject matter is not limited in its application to the details of construction and the arrangements of components set forth in the following description or illustrated in the drawings. The inventive subject matter is capable of other embodiments and of being practiced or being carried out in various ways. Also, it is to be understood that the phraseology and terminology used herein is for the purpose of description and should not be regarded as limiting on all embodiments of the inventive subject matter.

The inventive subject matter described herein provides a navigational system for a vehicle (e.g. aircraft) that includes a lighting assembly configured for emission of light (e.g. laser light). In one embodiment, the navigational system includes a lens array assembly that is configured to receive incoming light from the lighting assembly and change the direction of the incoming light received from the lighting assembly such that the outgoing light emanating from the lens array assembly is collimated in a first direction but diverges along a different, second direction. A scanning unit in alignment with the lighting assembly and is configured to direct the collimated beam in two orthogonal directions. The lighting assembly, the lens array assembly, and the scanning unit are configured to direct the light to form a visual beacon that guides navigation of a vehicle to a location.

In one embodiment, the lens array assembly includes a segmented micro optic lens array that redirects and controls the divergence of light (e.g., laser light) in a first direction (e.g., the horizontal direction), while collimating the light in a different, second direction (e.g., the vertical direction). The lens array assembly utilizes an array of N light sources (e.g., laser diodes), where the beams of light generated by the light sources is collimated in the second direction (e.g., the vertical direction) and diverges as 1/Nth of the full angular range in the first direction (e.g., the horizontal direction). The micro lens array assembly is configured to have progressively larger horizontal element decentration on lens elements (also referred to as lenslets) as one moves radially away from the center of the array. This causes the axial ray from light sources progressively farther from the center to be deflected at larger angles. By deflecting the beams towards the center, the required size of a scanning unit that reflects the light is greatly reduced, which makes the assembly compatible with the integrated photonic manufacturing approach on much smaller scales (e.g., sizes) than is currently available.

FIG. 1 illustrates one example of a navigational system 100 that generates light for operating as a beacon for navigating a vehicle, such as an aircraft 102. The system 100 includes a plurality of light sources in the form of lighting assemblies 104A and 104B to emit light 109 (e.g. laser light) through a plurality of lens array assemblies 106A and 106B. The navigational system 100 uses the lens array assemblies 106A and 106B to direct light 109 from the lighting assemblies 104A and 104B to scanning units 110A and 110B to form a visual beacon 112 having a predetermined shape, such as a square, rectangle, pyramid, rectilinear shape, curvilinear shape or other shape. The aircraft 102 can then use the visual beacon 112 for navigational purposes, such as determining where to land on a surface, as shown in FIG. 1. In other embodiments, aircraft can use the visual beacon 112 for alternate navigational purposes and/or aerobatic maneuvers, including but not limited to, landing or aerial refueling.

Figure 2A:
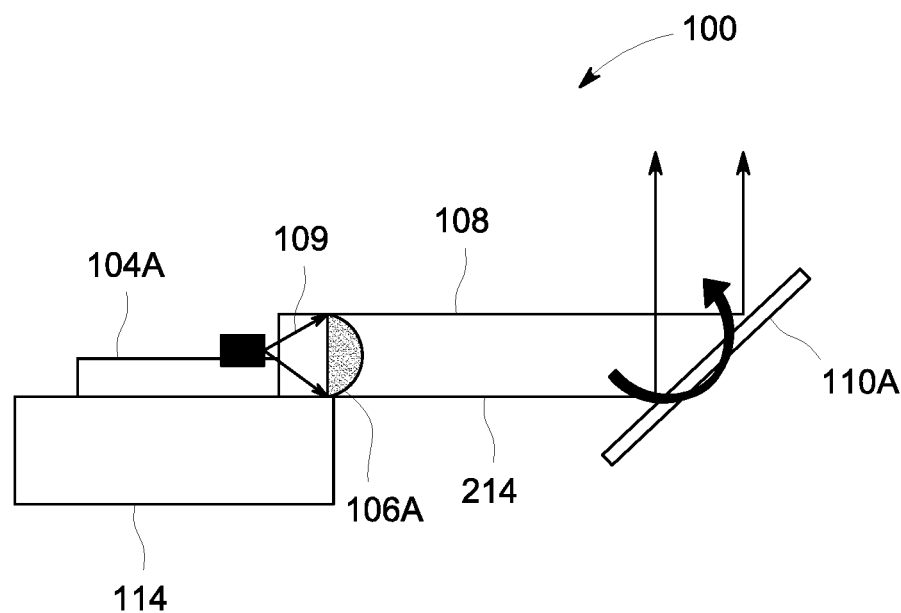
FIG. 2A illustrates a diagram of the navigational system according to an embodiment.
Figure 2B:
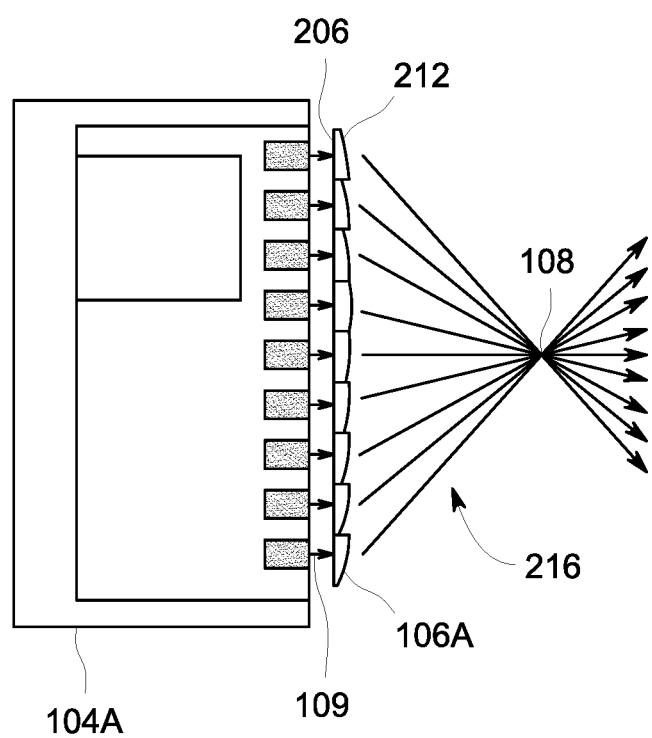
FIG. 2B illustrates a diagram of a lighting assembly according to an embodiment.
Figure 3:
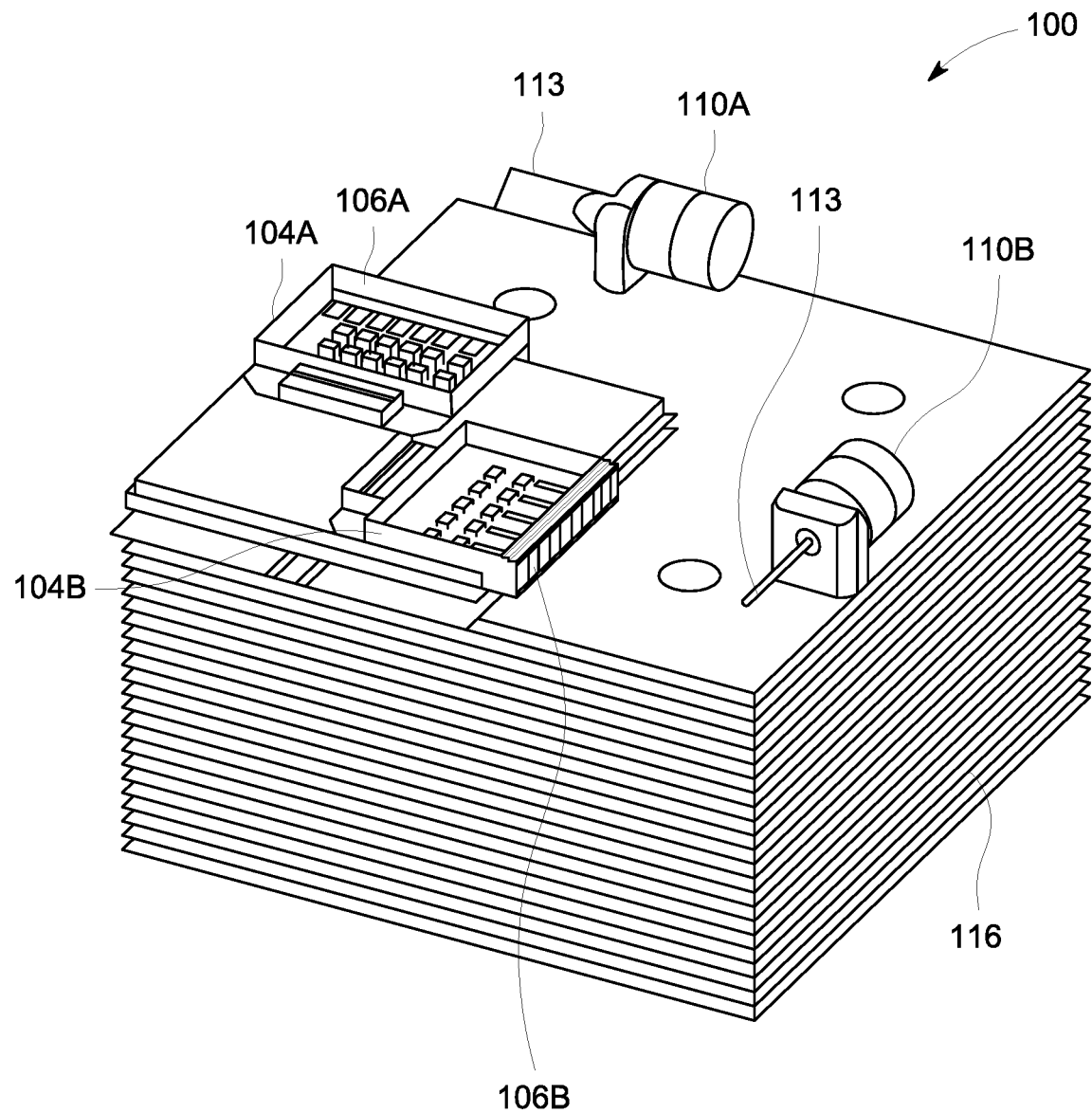
FIG. 3 illustrates a partial perspective view of the navigational system according to an embodiment.
Figure 4:
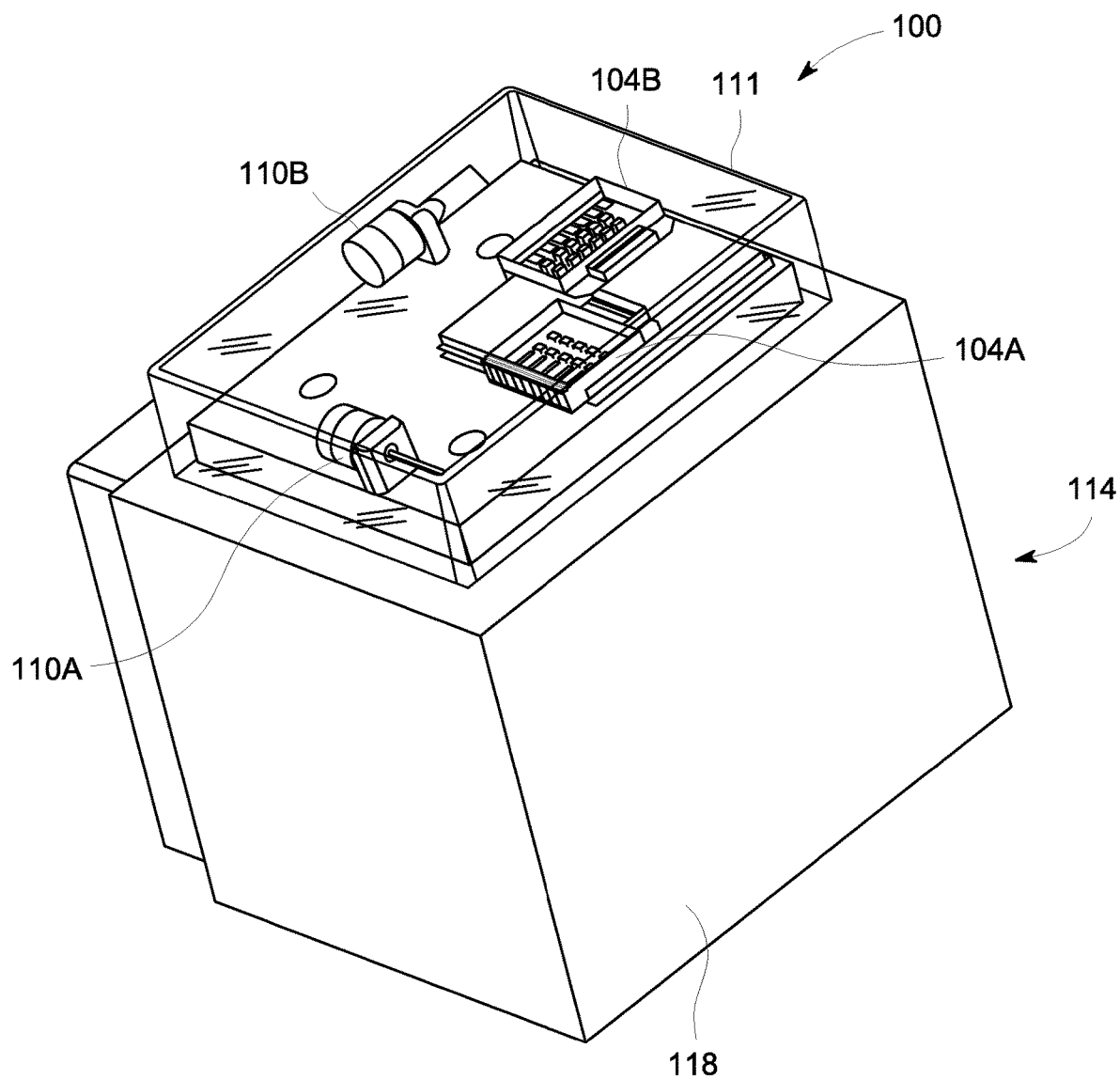
FIG. 4 illustrates a perspective view of the navigational system according to an embodiment.

FIGS. 2A and 2B illustrate diagrams of the navigational system 100 and the lighting assembly 104A. FIGS. 3-4 illustrates a perspective view of the navigational system 100 according to an embodiment. Each lighting assembly 104A and 104B, corresponding lens array assembly 106A and 106B, and corresponding scanning units 110A and 110B generate at least a portion of the visual beacon 112, which is generally rectangular having a top portion 112A, a bottom portion 112B, and side portions 112C. The lighting assembly 104A, lens array 106A, and scanning unit 110A generate the top and bottom portions 112A and 112B. Similarly, the lighting assembly 104B, lens array assembly 106B, and scanning unit 106B generate the side portions 112C.

For example, the lighting assembly 104A emits light 109 (e.g. laser light) to the lens array assembly 106A (FIGS. 2A-2B). The incoming light 109 from the lighting assembly 104A is diffracted and refracted by the lens array assembly 106A to form a collimated light beam as outgoing light 108 that emanates from the lens array assembly 106A. The outgoing light or beam 108 is collimated in a first direction (e.g., vertical direction) such that all or substantially all (e.g., at least 95%, at least 97%, or at least 99%) of the outgoing light 108 is directed in a parallel, non-spreading or non-diverging direction when viewed along the vertical direction 214 (FIG. 2A). In one embodiment, the outgoing light 108 is vertically collimated such that the light is contained within (and does not substantially extend outside of) a dimension of no more than 3.4 millimeters. Alternatively, the outgoing light 108 can be contained in a smaller or larger dimension. Conversely, the lens array assembly 106A can diffract the incoming light 109 so that the outgoing light 108 diverges or spreads out in the second direction (e.g., an orthogonal or perpendicular direction, such as the horizontal direction 216 (FIG. 2B)). Different configurations of the lens array assembly 106 can diverge the portion of the incoming light 109 differently so that the beams of the outgoing light 108 from the lens array assembly is orientated in a different direction. In one embodiment, the outgoing light 108 diverges along a sixty-degree angle as the light emanates from the lens array assembly 106. Alternatively, the outgoing light 108 diverges along or within a smaller or larger angle. In alternate embodiments, another number, including one, and another configuration of lighting assemblies and lens array assemblies can be used to generate other shapes of the visual beacon 112.

Figure 5:
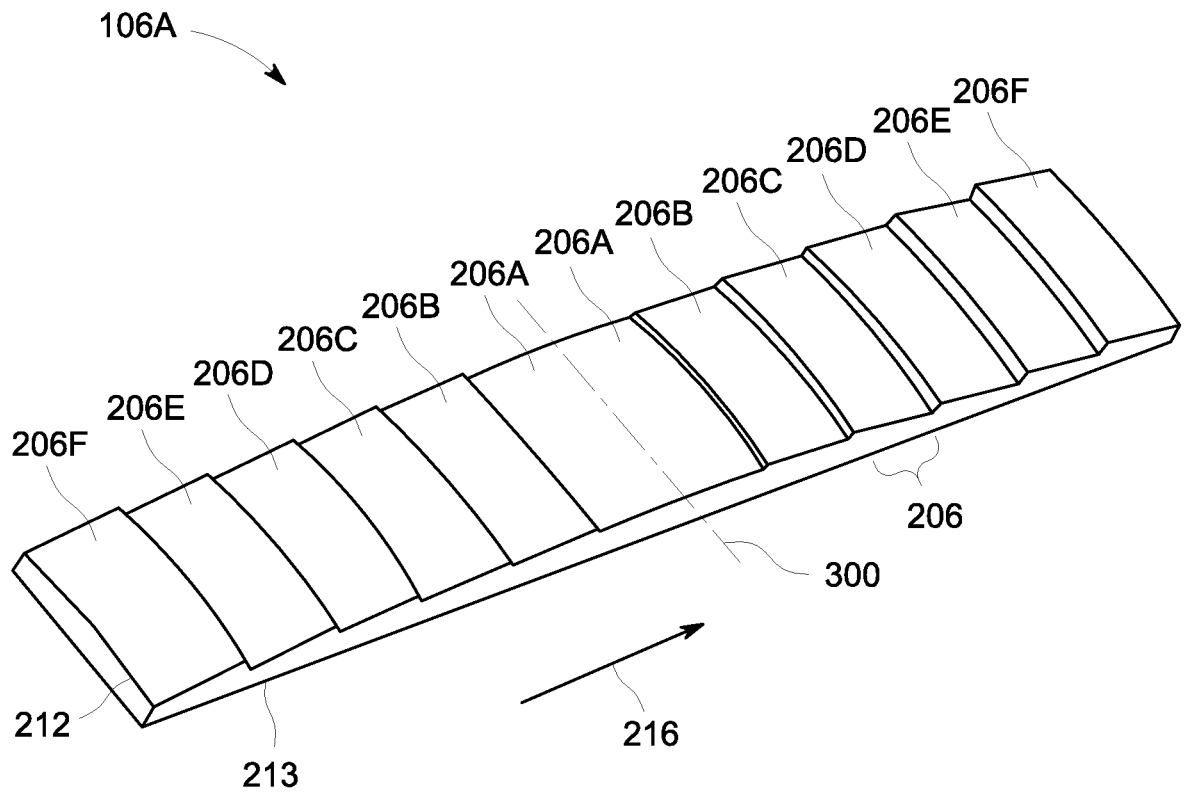
FIG. 5 illustrates a perspective view of a lens array assembly according to one embodiment.

FIG. 5 illustrates a perspective view of a lens array assembly 106A according to one embodiment. In the illustrated embodiment, the lens array assembly 106A includes twelve lens elements, or lenses (e.g., lens elements 206A-F). Alternatively, the lens array assembly 106A can include a different number of lens elements. Also, the lenses 206 can be formed as a single optic body or as separate optic bodies. The optic body may be a sheet or planar body of a material that receives, diffracts, and refracts light as described herein. In one embodiment, the optic body is a sheet of silicon. Alternatively, the optic body is formed from another material, such as a glass or polymer. The optic body is relatively thin prior to an etching process. For example, the optic body can be formed from a sheet of silicon that is no thicker than one millimeter. Alternatively, a thicker or thinner optic body can be used.

In one embodiment, a lens array assembly 106A is provided that includes plural lens elements 206 each configured to receive incoming light 109 from one or more light sources. The lens elements 206 include biconic refractive surfaces (also referred to as biconic refractive elements) on the front sides 212 of the lens elements 206 and diffractive surfaces (also referred to as diffractive elements) on the opposite, back sides 213 of the lens elements 206. The lens elements 206 are configured to change directions of the incoming light received from the lighting assembly 104A such that the outgoing light 108 emanating from the front surfaces or sides 212 of the lens elements 206 is collimated in a first direction but diverges along a different, second direction. For example, this outgoing light 108 may be collimated along or in a vertical direction 214 but diverge or spread out in an orthogonal direction, such as a horizontal direction 216 in which the lens elements 206 are arranged side-by-side.

The lens elements 206 can be arranged in different groups. For example, one group of lens elements 206 can include one of each of the lens elements 206A-F and another group of the lens elements 206 can include another one of each of the lens elements 206A-F. As a result, the lens elements 206 in the lens array assembly 106A are arranged in groups that are symmetrical about a center line 300 of the lens array assembly 106A. Each group or set of the lens elements 206A-F can create a different portion of the horizontally spread out outgoing light 108 shown in FIG. 2B. For example, another group or set of the lens elements 206A-F can create another outgoing light 108 shown in FIG. 2B, but that is on one side of the outgoing light 108 shown in FIG. 2B. The location of the lens elements 206 and the orientation of the different center directions of the outgoing light 108 from each lens element 206 can result in the portion of the outgoing light 108 from one or more lens elements 206 overlapping or crossing the portion of the outgoing light 108 from one or more other lens elements 206 before the focal point of the light, as shown in FIG. 2B. The combination of the vertically collimated outgoing light 214 (FIG. 2A) and the horizontally diverging or spread outgoing light 216 (FIG. 2B) can create a linear shape of light, such as one of several lines of light generated by the lighting system described above. As shown in FIG. 2B, the portion of the outgoing light 108 emanating from each lens elements 206A-F only partially overlaps (e.g., by three degrees or less) the portion of the outgoing light 108 emanating from the neighboring lens element 206 or each of the portions of the outgoing lights 108 emanating from the neighboring lens elements 206 on each side of the lens element 206. This overlap occurs after the portions of outgoing light 108 have crossed over each other.

Figure 6:
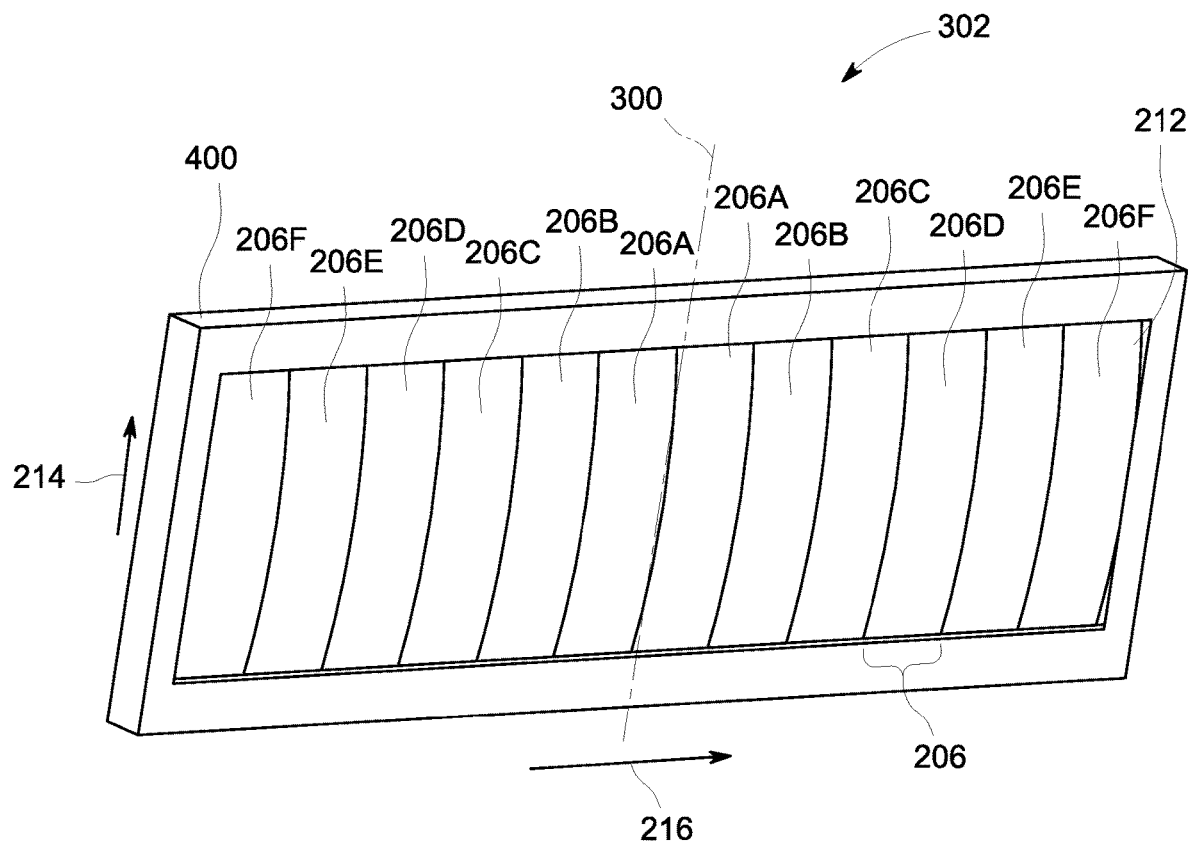
FIG. 6 illustrates a perspective view of a lens array assembly according to another embodiment.

FIG. 6 illustrates a perspective view of another embodiment of a lens array assembly 302. The lens array assembly 302 may be used in place of the lens array assembly 106A in the lighting assembly 104A shown in FIG. 2B. One difference between the lens array assemblies 106A, 302 shown in FIGS. 7 and 8 and the lens array assembly 302 is that the lens array assembly 302 includes a border or frame 400 extending around or encircling the lens elements 206 in the lens array assembly 302.

The lens array assemblies 106A, 106B, and 302 may be formed from silicon or another material. The lens array assemblies 106A, 106B, and 302 can be formed by applying a photoresist to a silicon body, exposing the photoresist to light (e.g., ultraviolet light) through a grayscale mask to form insoluble portions of the photoresist, and exposing the insoluble portions of the photoresist and portions of the silicon body outside of the insoluble portions of the photoresist. Each lens element 206 can be relatively small. For example, each lens element 206 can have a width dimension measured along the horizontal direction 216 that is no more than 2.2 millimeters and a height dimension measured along the vertical direction 214 that is no more than 3.4 millimeters. Optionally, the lens elements 206 may have a larger width dimension and/or height dimension.

The scanning units 110A and 110B (e.g. as a microelectromechanical system (MEMS) scanner mirror or a miniature galvanometer) are positioned in alignment with the lighting assembly 104A 104B to receive the outgoing light 108. The scanning unit 110A directs the outgoing light 108 in two orthogonal directions to form the top and bottom portions 112A and 112B of the visual beacon 112 (FIG. 1). The scanning unit 110B directs the outgoing light 108 in two orthogonal directions to form the side portions 112C of the visual beacon 112 (FIG. 1). For example, the scanning unit 110A can include a mirror 113 that oscillates in a periodic motion to direct the outgoing light 108 between the position of the top portion 112A and the position for the bottom portion 112B (FIG. 3). Similarly, the scanning unit 110B can include a mirror that oscillates in a periodic motion to direct the outgoing light 108 between the positions of the side portions 112C.

FIG. 3 illustrates a partial perspective view of the navigational system 100 according to an embodiment. FIG. 4 illustrates a perspective view of the navigational system 100 according to an embodiment. The lighting assemblies 104A and 104B are operatively and mechanically mounted to a cooling device 114. The lighting assemblies 104A and 104B are positioned generally at a right angle relative to each other and aligned to emanate outgoing light to a corresponding scanning unit 110, such as a microelectromechanical system (MEMS) scanner mirror or a miniature galvanometer which is described in more detail below. Each scanning unit 110 is mounted to the cooling device 114 at a predetermined distance from the corresponding lighting assembly 104A and 104B. However, another number, including one, or another configuration of lighting assemblies 104 and corresponding scanning units 110 can be used to direct light into the requisite visual beacon. A housing 111 mounts to the cooling device 114 to encase and hermetically seal the lighting assemblies 104 and scanning units 110. The housing 111 is preferably made from a transparent material that allows the beam 108 to pass through without interference.

The cooling device 114 manages a temperature of each of the lighting assemblies 104A, 104B. For example, the cooling device 114 may regulate the temperature of the laser to provide extended continuous operation. For stable operation, the temperature of the lighting assemblies 104 must be tightly regulated. During operation, the lighting assemblies 104 may produce a significant amount of heat, which must be removed to maintain a proper temperature and stable operation. The cooling device 114 controls a temperature of the laser diodes 124, the lens array 106, and the controller 122.

In one or more embodiments, the cooling device 114 may be a vapor chamber heatsink 116 that transfers heat from the lightening assemblies 104 to a thermoelectric cooler 118, which transfers heat to the ambient environment outside the thermoelectric cooler 118. For example, the laser diodes 124, the lens array 106, and the controllers 122 may be disposed on a first side of a substrate 120 of the lighting assembly 104, and the heat sink 116 may be disposed on an alternative side of the substrate 120. The heat sink 116 and cooler 118 should have sufficient heat transfer capacity to dissipate a larger amount of heat than the lighting assembles 104 can generate. This allows the lighting assemblies 104 to run below their minimum temperature requirement and operate continuously. If either the heat sink 116 or the cooler 118 does not provide sufficient heat transfer capacity, heat will build up in the lighting assemblies and destabilize. Although the capability to run continuously may be preferred, configurations that provide limited times of operation, such as hours or even tens of minutes, may also be used. In the embodiment of FIGS. 3-4, the cooling device includes both a primary heat sink and a secondary heat sink to transfer heat from the lighting assemblies 104. However, any suitable number, including one, or configuration can be used to provide the requisite mass and heat transfer. In addition, any type of cooling device can be used, such as mercury cooling, finned heat sinks, micro channel cooling, and the like. In one or more embodiments, the cooling device may be formed on or within the substrate, or coupled with one or more surfaces of the substrate using any manufacturing process. For example, the cooling device may be a thermoelectric cooler that may be a component or device formed or coupled with the substrate that is made of materials that can be deposited using any semiconductor processors.

In one or more embodiments, the cooling device 114 may be a heat-spreader. The heat-spreader may be integrated with the substrate, such that the heat-spreader may be formed as a unitary body with the substrate 120. Optionally, the heat-spreader may be a conductive substrate itself, manufactured of a solid material, such as a ceramic material, that may be embedded on the top of, in the middle, of, or below the substrate 120. In one or more embodiments, the heat-spreader may be integrated with the ceramic material of the substrate at one or more specific positions or locations within the substrate. For example, the heat-spreader may be integrated with the substrate at a position that is proximate the laser diodes 124 to manage a temperature of the laser diodes 124. Optionally, the heat-spreader may be a conductive substrate itself that may be formed and/or coupled with the substrate 120, or optionally the lighting assembly may be disposed directly on the heat-spreader substrate.

In one or more embodiments, the cooling device 114 may be a system that includes a vapor chamber and ultrathin heat pipes that may be formed or fabricated on or within the substrate 120. For example, a cooling fluid may move within the vapor chamber and the heat pipes that may receive thermal energy from one or more components of the lighting assembly, and may transfer the thermal energy away from the one or more components of the lighting assembly and to the ambient environment outside of the vapor chamber.

In one or more embodiments, one or more cooling devices 114 may be operably coupled with each of the laser diodes 124. The cooling devices 114 may be formed with or coupled with each of the laser diodes 124 to control or manage a temperature of each of the laser diodes 124. For example, the laser diodes 124 may produce an amount of thermal energy that is greater than an amount of thermal energy produced by the lens array and/or the controller 122. The cooling devices 114 may be strategically placed proximate to or coupled with (e.g., embedded into, placed on top of, placed below, or the like) each of the laser diodes 124 to maintain a proper temperature and stable operation of each of the laser diodes 124.

In one or more embodiments, one or more cooling devices 114 may be operably coupled with each of the photo diodes 126. For example, the photo diodes 126 may produce an amount of thermal energy that is greater than an amount of thermal energy produced or generated by the lens array 106 and/or the controller 122. One or more cooling devices 114 may be strategically placed proximate to or coupled with each of the photo diodes 126 to maintain a proper temperature and stable operation of each of the photo diodes 126. Optionally, in one or more embodiments, the same or a common cooling device may be used to control a temperature of one of the laser diodes 124 and one of the photo diodes 126. For example, one of the laser diodes 124 and one of the photo diodes 126 may share or transfer heat to a common cooling device 114. Optionally, the lighting assemblies 104 may include any alternative cooling device and/or cooling system to control a temperature of each of the lighting assemblies 104.

Figure 7:
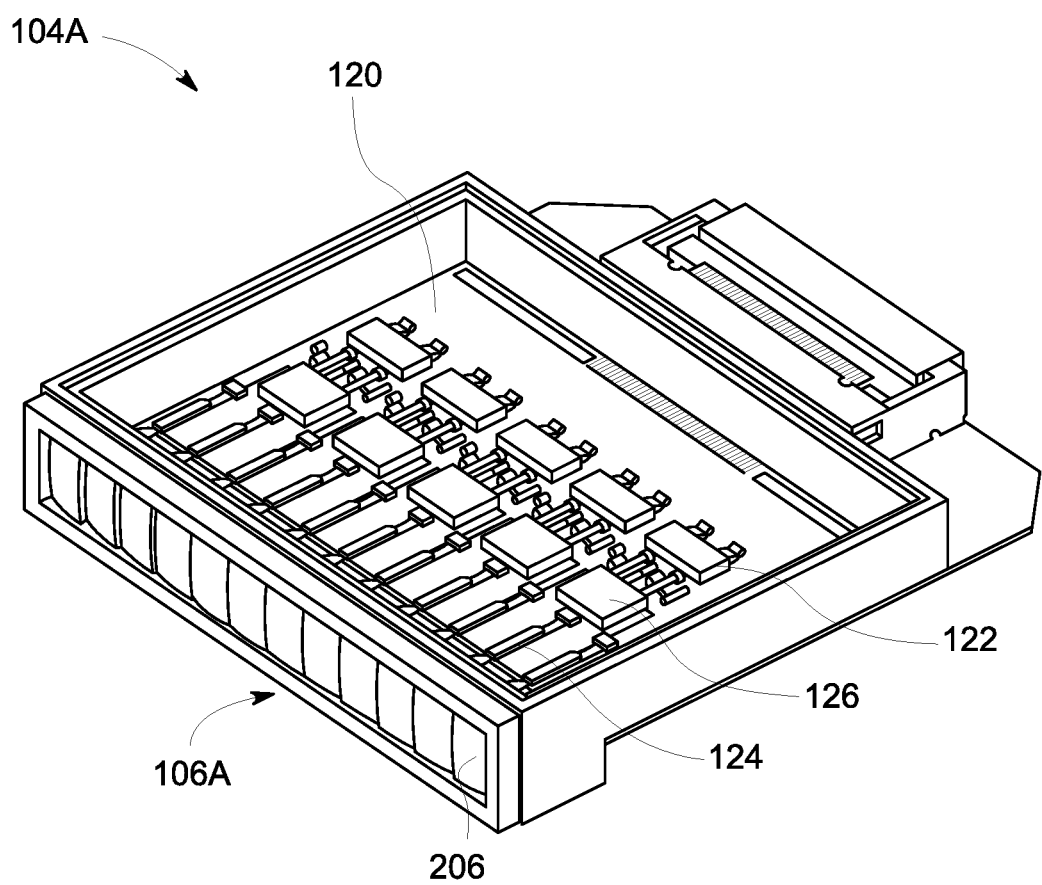
FIG. 7 illustrates a front perspective view of the lighting assembly according to an embodiment.
Figure 8:
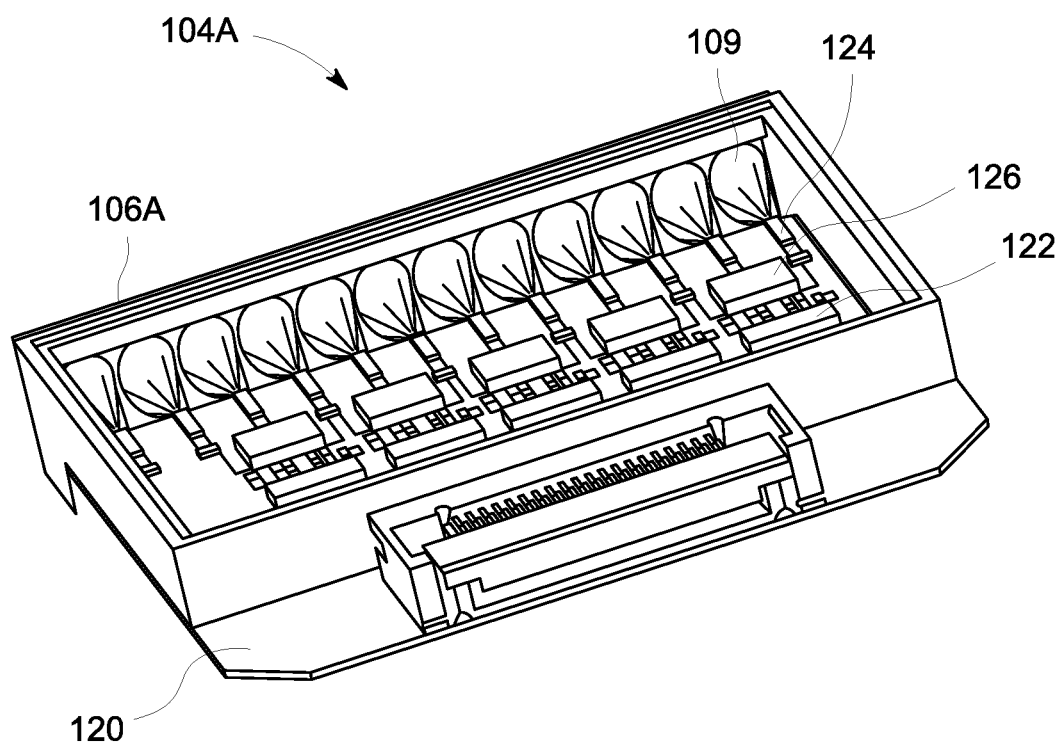
FIG. 8 illustrates a rear perspective view of the lighting assembly according to an embodiment.

FIG. 7-8 illustrates a front and rear perspective view of the lighting assembly 104A according to an embodiment. The lighting assembly 104A includes a substrate 120 operatively and mechanically connected with a controller or driver 122, plurality of laser diodes 124, a plurality of photodiodes 126, and the lens array assembly 106A. The controller 122 is operatively connected to the laser diodes 124, photodiodes 126, and scanning units 110 to control the operations of the navigational system 100.

The controller 122 is an integrated circuit that may include one or more computer processors. The controller 122 is electrically connected to the plurality of laser diodes 124, either in series or parallel, to provide power for generating light from the laser diodes 124. The supply of power from the controller 122 is regulated to prevent damage to the laser diodes 124 from receiving too much power or other irregularities. For example, if one of the diodes fails and becomes an electrical short, the controller will experience a sudden decrease in its load voltage.

The illustrated embodiment includes twelve laser diodes 124 electrically connected to twelve photodiodes 126. Each laser diode 124 preferably has a 0.8 W output power and emits a 1570 nanometer wavelength. However, another suitable laser diode configuration can be used. The laser diodes 124 can all generate light having the same or substantially the same (e.g., within 3%) wavelength, such as 1570 nanometers. This light is received by the lens elements 206 into or through a back surface or side 210 of each lens element 206. The light that is generated by the laser diodes 124 and received by the lens elements 206 can be referred to as incoming light. The light passes through the lens elements 206, is collimated, diffracted, and/or refracted by the lens elements 206, and exits or emanates from opposite front surfaces or sides 212 of the lens elements 206 as outgoing light in a substantially linear line-shaped beam 108. The controller 122 can control the light output by each laser diode 124. Optionally, another type of laser diode 124 can be used, or at least one of the laser diodes 124 can generate light that is received by two or more of the lens elements 206.

The controller 122 electrically connects to the plurality of photodiodes 126, which detect the optical power of laser diodes 124 and regulate the power to the laser diodes 124 so the laser diodes 124 do not go above a certain predetermined threshold to prevent damage. Alternatively, photodiodes 126 can be replaced with other suitable photodetectors including, but not limited to, avalanche photodiodes, solid state photodetectors, or photomultipliers. Based on signals from the photodiodes 126, the controller 122 can control the light output of the laser diodes and maintain the appropriate power level, intensity level, and/or other parameters.

The controller 122 electrically connects with the scanning unit 110A (e.g. as a microelectromechanical system (MEMS) scanner mirror or a miniature galvanometer) to direct the outgoing light 108 in two orthogonal directions to form the top and bottom portions 112A and 112B of the visual beacon 112 (FIG. 1). For example, the controller 112 can oscillate the mirror 113 in a periodic motion to direct the outgoing light 108 between the position of the top portion 112A and the position for the bottom portion 112B (FIG. 3). Similarly, the controller 112 can oscillate the mirror 113 of the scanning unit 110B in a periodic motion to direct the outgoing light 108 between the positions of the side portions 112C.

The controller 122 can also electrically connect to the cooling device 114 to monitor and regulate the temperature of the laser diodes 124 and other components to prevent over or under temperature conditions during operation.

The controller 122, plurality of laser diodes 124, and plurality of photodiodes are mounted to the substrate 120. The substrate 120 is an optical bench preferably made from a material with a high heat conductivity to aid the transfer of heat transfer from the mounted components to the cooling device 114. In addition, the substrate should be substantially flat and free of warpage, maintaining the angular orientation and vertical alignment between the laser diodes, the lens array assembly, and the corresponding scanning unit 110. For example, the substrate can be made from a ceramic or ceramic composite material, such as an Aluminum Nitride base material. Other possible choices of thermally conductive materials for the substrate could be beryllium oxide (BeO) or translucent cubic boron nitride (T c-BN). Non-ceramic materials, such as thermoset resins, can be also used, unless organic materials are to be avoided to prevent contamination of the devices in the package. Alternatively, the substrate can be a printed circuit board.

The components of the lighting system 104 can be mounted to the substrate 120 with surface mount technology that allows for pick and place type assembly, such as flip chip. This allows for faster assembly, tighter alignment tolerances, and higher yields.

In an alternate embodiment, the controller 122 is formed within the substrate 120 that the other electrical components are mounted to. This allows for high speed modulation of the high current laser diodes. The stray inductance and capacitance of the electrical interconnects can be greatly reduced, allowing for higher data rate transmission of navigation data to incoming aircraft.

Figure 9:
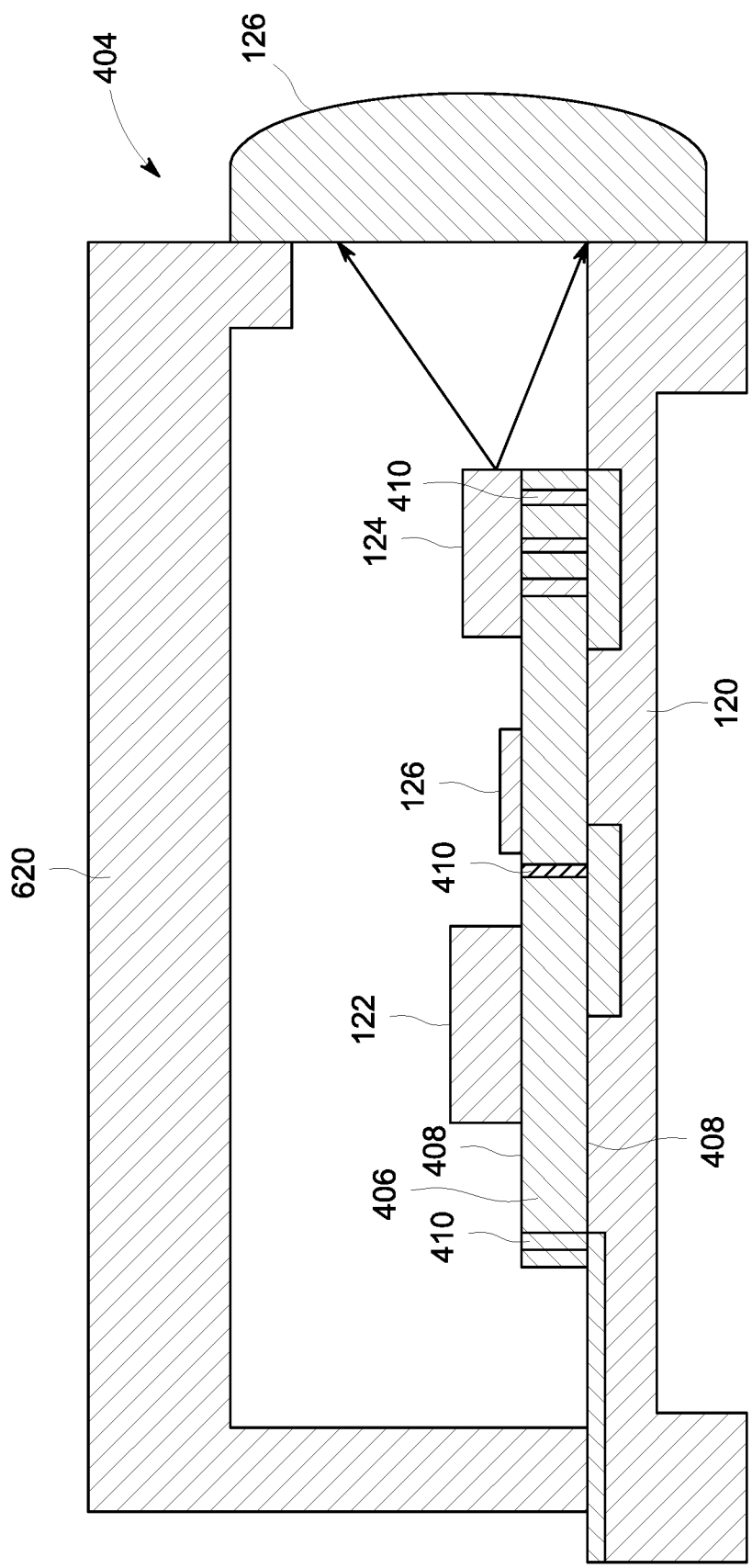
FIG. 9 illustrates a cross section view of an alternate embodiment of a lighting assembly.

FIG. 9 illustrates a section view of a lighting assembly 404 according to an alternate embodiment, which is similar to the embodiment of the lighting assembly 104A of FIGS. 7-8, including the substrate 120, the controller 122, the plurality of laser diodes 124, the plurality of photo diodes 126, and the lens array assembly 206. However, the lighting assembly 404 also includes an interposer 406 operatively and mechanically connected between the substrate 120 and the controller 122, plurality of laser diodes 124, and the plurality of photodiodes 126. The interposer 406 is a printed circuit board preferably made from a material with a high heat conductivity to aid the transfer of heat transfer from the mounted components to the cooling device 114. In addition, the substrate should be substantially flat and free of warpage, maintaining the angular orientation and vertical alignment between the laser diodes, the lens array assembly, and the corresponding scanning unit 110. For example, the interposer 406 can be made from silicon or a ceramic or ceramic composite material, such as an Aluminum Nitride base material. Other possible choices of thermally conductive materials for the substrate could be beryllium oxide (BeO) or translucent cubic boron nitride (T c-BN). Non-ceramic materials, such as thermoset resins, can be also used, unless organic materials are to be avoided to prevent contamination of the devices in the package.

The interposer 406 includes upper and lower board surfaces 408 that face in opposite directions and electrical contacts 410 coupled to one another through the interposer 406 with traces (not shown). In the illustrated embodiment, the electrical contacts 410 are pre-defined bond pads. The interposer may also include a thermal management layer (not shown) 408 of the interposer 406, such as a passive cooling device or an active cooling device. An opto-mechanical housing 111 mounts to the substrate 120 to enclose lighting assemblies 404.

Figure 10:
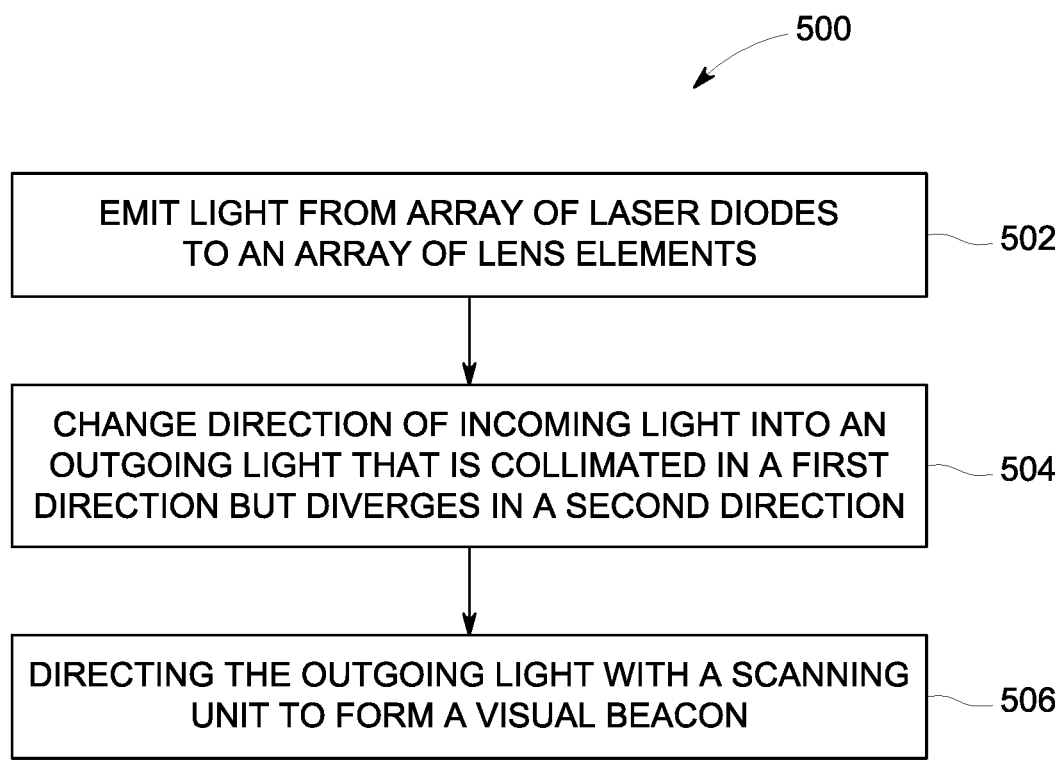
FIG. 10 illustrates a flowchart of one embodiment of a method for operating the navigational system.

FIG. 10 illustrates a flowchart of one embodiment of a method for operating the navigational system 500. At 502, a light emits from an array of laser diodes 124 to an array of lens elements 206. At 504, the array of lens elements 206 changes the direction of the incoming light 109 into an outgoing light 108 that is collimated in a first direction 214 but diverges along a different, second direction 216. At 504, each scanning unit 110A and 110B in alignment with the outgoing light 108 directs the light to in two orthogonal beams to form a visual beacon 112 that guides navigation of a vehicle 102 to a location.

Figure 11:
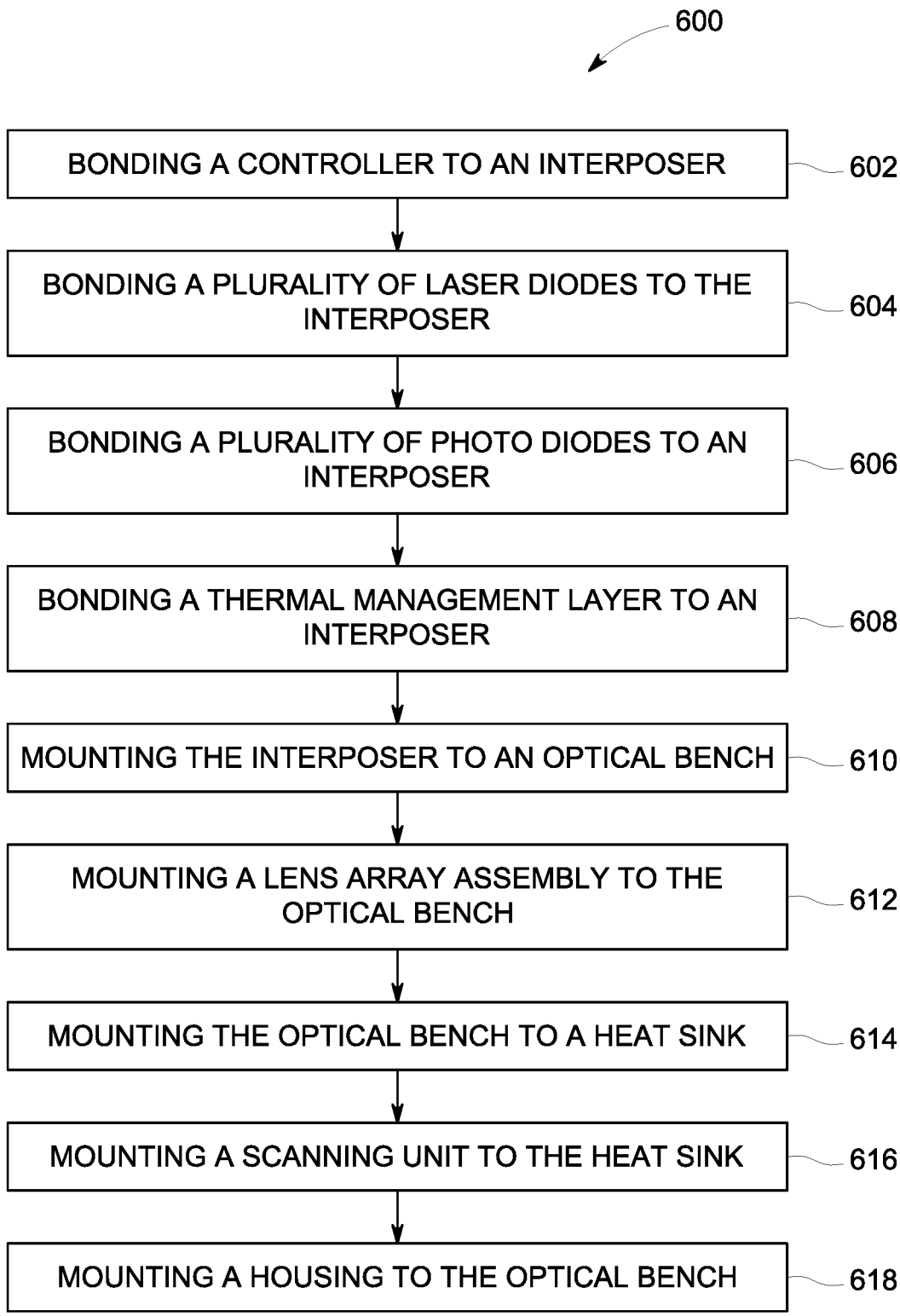
FIG. 11 illustrates a flowchart of one embodiment of a method of assembling the navigational system.

FIG. 11 illustrates a flowchart of one embodiment of a method for assembling a navigational system 600. At 602, a controller is bonded to an interposer having electrical contacts coupled by traces. At 604, a plurality of laser diodes is bonded to the interposer and electrically connected through the electrical contacts and traces to the controller. At 606, a plurality of photo diodes is bonded to the interposer and electrically connected through the electrical contacts and traces to the controller. At 608, a thermal management layer is bonded to the interposer. At 610, the interposer is mounted to an optical bench. At 612, a lens array assembly is mounted to the optical bench, such as with a pick and place process, to receive incoming light from the laser diode and change the direction of the incoming light received from the laser diode. The outgoing light emanating from the lens array assembly is a beam collimated in a first direction but diverging along a different second direction. At 614, the optical bench mounts to a heat sink or cooling device. At 616, a scanning unit mounts to the heat sink in alignment with the lens array assembly for direction of the collimated beam in two orthogonal directions. The scanning unit is electrically connected to the controller. At 618, the lighting assembly is at least partially covered by an opto-mechanical housing.

Figure 12:
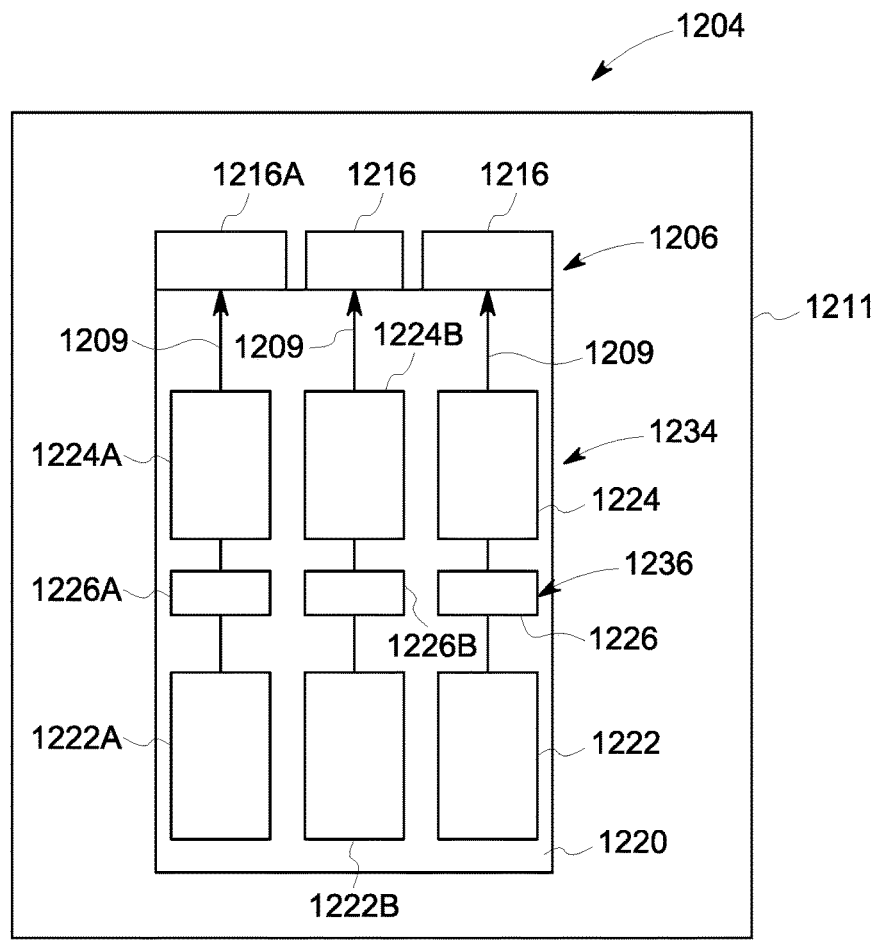
FIG. 12 illustrates a top view of a lighting assembly according to an embodiment.

FIG. 12 illustrates a lighting assembly 1204 in accordance with one embodiment. Similar to the lighting assembly 104, the lighting assembly 1204 includes plural laser diodes 1224 of a laser diode array 1234, a lens array 1206 including plural lens elements 1216, plural photo diodes 1226 of a photo diode array 1236, and plural controllers 1222 disposed on a common surface of a substrate 1220. In the illustrated embodiment of FIG. 12, the plural laser diodes 1224 are part of the laser diode array 1234 that includes three separate laser diodes 1224. Optionally, the laser diode array 1234 may include less than three or more than three laser diodes 1224. Each of the three laser diodes 1224 are individually optically connected with three different lens elements 1216 of the lens array 1206. For example, each of the three laser diodes 1224 are configured to emit light toward the lens array 1206. Additionally, each of the three separate laser diodes 1224 are individually electrically coupled with three different controllers 1222 and optically coupled with three different photo diodes 1226. For example, a first controller 1222A may control operation of a first photo diode 1226A and control operation of a first laser diode 1224A, and s second controller 1222B may control operation of a second photo diode 1226B and control operation of a second laser diode 1224B. Additionally or alternatively, the lighting assembly 1204 may include a single laser diode 1224 and a single photo diode 1226, optionally may include a single laser diode 1224 and be void the photo diode 1226, may include any number of laser diodes 1224, photo diodes 1226, and lens elements 1216, or any combination therein.

Optionally, the lighting assembly 1204 may include a single controller that may control operation of each of the different laser diodes 1224 and each of the different photo diodes 1226. For example, the single controller may individually control a power level of each of the three laser diodes 1224 and control a power level of each of the three photo diodes 1226. Each of the different laser diodes 1224 may be set with a different amount of power level or optical output level relative to each other laser diode 1224. For example, a single controller may be electrically coupled with a first laser diode 1224A and a first photo diode 1226A, and may control operation of the first laser diode 1224A and the first photo diode 1226A. Additionally, the same single controller may be electrically coupled with a second laser diode 1224B and a second photo diode 1226B, and may control operation of the second laser diode 1224B and the second photo diode 1226B. The single controller may control operation of the first laser diode 1224A to operate at a first power level or power setting, and the same single controller may control operation of the second laser diode 1224B to operate at a second power level or power setting that is greater than or less than the first power level of the first laser diode 1224A. In one or more embodiments, the first laser diode 1224A may have a maximum power output that is greater than or less than a maximum power output of the second laser diode 1224B. Additionally, the first photo diode 1226A may have a maximum power output that is greater than or less than a maximum power output of the second photo diode 1226B.

The lens array 1206, the laser diodes 1224, the photo diodes 1226, and the controllers 1222 are disposed in a common housing 1211 and are disposed on a common surface of the substrate 1220. Optionally, one or more components of the lighting assembly 1204 may be disposed on an alternative surface or side of the substrate 122. The substrate 1220 may be manufactured of a ceramic or ceramic composite material, such as an Aluminum Nitride base material. Other possible choices of thermally conductive materials for the substrate could be beryllium oxide (BeO) or translucent cubic boron nitride (T c-BN). Optionally, the substrate may be a non-ceramic material. Non-ceramic materials, such as thermoset resins, can be also used, unless organic materials are to be avoided to prevent contamination of the devices in the package. Alternatively, the substrate can be a printed circuit board. In one or more embodiments, a cooling device, such as a heat-spreader or heat sink, may be disposed on an alternative side of the substrate 1220. Optionally, a cooling device may be embedded within the substrate 1222. Optionally, a cooling device may include a cooling vapor chamber and heat pipes that may be embedded within the substrate to form a unitary body with the structure. The cooling device may be strategically disposed proximate each of the laser diodes 1224 relative to the lens array 1206 to manage a temperature of each of the laser diodes 1224.

The lighting assembly 1204 emits light 109 (e.g. laser light) to the lens array 1206. The incoming light 109 from each of the laser diodes 1224 is diffracted and refracted by the lens array 1206 to form a collimated light beam as outgoing light that emanates from the lens array 1206. The outgoing light or beam is collimated in a first direction (e.g., vertical direction) such that all or substantially all (e.g., at least 95%, at least 97%, or at least 99%) of the outgoing light is directed in a parallel, non-spreading or non-diverging direction when viewed along the vertical direction.

In one or more embodiments, the substrate 1220 may include one or more grooves, notches, or the like, that may be disposed between one of the laser diodes 1224 and one of the lens elements 1216. The grooves or notches may be fabricated into a surface of the substrate 1220. For example, the grooves may be machined, etched, or the like, into the substrate 1220. The grooves or notches may house or hold an optical fiber (not shown) that may be operably coupled with one of the laser diodes 1224 at a first end of the optical fiber, and may be operably coupled with one of the lens elements 1216 at a second end of the optical fiber. For example, the light emitted from the laser diode 1224 may be directed to the lens element 1216 of the lens array 1206 via the optical fiber. In one or more embodiments, the laser diode 1224 optically coupled with one of the lens elements 1216 via the optical fiber may have any orientation relative to the lens element 1216. Additionally, the laser diode 1224 may be placed at one or more different positions on the substrate 1220 to strategically manage the thermal energy produced by the laser diode 1224. For example, the laser diode 1224 may be disposed proximate a cooling device to maximize heat dissipation and minimum heat flux on the substrate.

In one or more embodiments, a single optical fiber may optically couple a first laser diode 1224A with a first lens element 1216A. Optionally, the optical fiber may optically couple a first laser diode 1224A with two or more different lens elements 1216. Optionally, the lighting assembly 1204 may have any number of optical fibers that may optically couple any number of laser diodes 1224 with any number of lens elements 1216. Additionally, the lighting assembly 1204 may include any number of optical fibers that may optically couple any number of lens elements 1216 with any number of photo diodes 1226.

Figure 13:
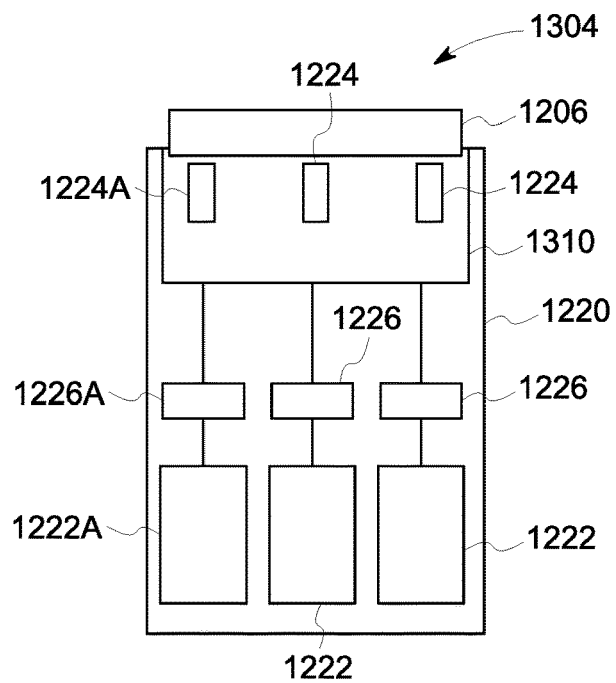
FIG. 13 illustrates a top view of a lighting assembly according to another embodiment.

FIG. 13 illustrates one embodiment of a lighting assembly 1304. The lighting assembly 1304 is similar to the lighting assembly 1204 illustrated in FIG. 12 such that each of the photo diodes 1226 and the controllers 1222 are disposed on a common surface of the substrate 1220. In the illustrated embodiment of FIG. 13, the laser diodes 1224 are disposed on or coupled with a semiconductor material an insulator material 1310 that is coupled with the substrate 1220. The semiconductor material or insulator material 1310 may be made of an electrical conductor or insulator material, such as, but not limited to, silicon, germanium, gallium arsenide, indium phosphide, or the like. Each of the laser diodes 1224 may be spaced apart from each other laser diode 1224.

Additionally or alternatively, the semiconductor material or insulator material 1310 may include one or more slots (not shown) that may receive or mate with each of the lens elements 1216 of the monolithic lens array 1206. Optionally, the edge surface of the semiconductor material or insulator material 1310 may be machined to enable mating of the lens elements 1216 for precise alignment of the laser diodes to their respective lens element 1216. In one or more embodiments, the semiconductor material or insulator material 1310 and/or the substrate 1220 may include one or more alignment features, such as slots or notches, to align the laser diode array 1234 with the lens array 1206. Optionally, a cooling device may be disposed between the insulator material 1310 and the substrate 1220 to manage the temperature and/or thermal energy generated by the laser diodes 1224. Additionally or alternatively, a cooling device may be coupled with a first side or surface of the insulator material 1310, and the substrate 1220 may be coupled with an alternative side or surface of the insulator material 1310. The cooling device may include vapor chambers, heat pipes, thermoelectronics, heat spreaders, or the like. In one or more embodiments, an interposer (such as interposer 406 illustrated in FIG. 9) may be mechanically coupled with and disposed between the insulator material 1310 and the substrate 1220. Optionally, the laser diodes 1224 may be embedded with or within the interposer between the insulator material 1320 and the substrate 1220. Optionally, the lighting assembly 1304 may have an alternative configuration.

In one or more embodiments, the laser diodes 1224 may be electrically coupled with one or more electrical traces that may be fabricated onto or within the substrate 1220, fabricated onto or within the insulator material 1310, or the like. The electrical traces may electrically couple each of the laser diodes 1224 to the one or more of the controllers 1222, electrically couple each of the laser diodes 1224 to each of the photo diodes 1226, or the like.

Figure 14:
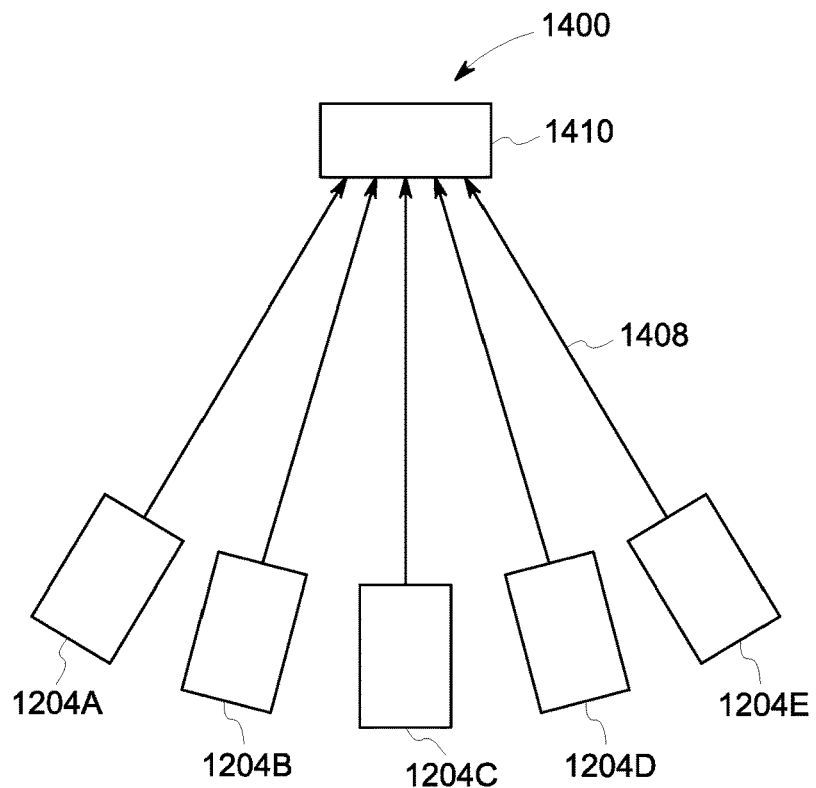
FIG. 14 illustrates a top view of one embodiment of a lighting system.

FIG. 14 illustrates a lighting system 1400 in accordance with one embodiment. The lighting system 1400 may include one or more of the lighting assemblies 1204 illustrated in FIG. 12, one or more of the lighting assemblies 1304 illustrated in FIG. 13, one or more of the lighting assemblies 104 illustrated in FIGS. 3 through 9, or any combination therein.

In the illustrated embodiment of FIG. 14, each of the lighting assemblies 1204 are disposed in individual housing modules. Optionally, two or more of the lighting assemblies 1204 may be disposed in a common housing module (not shown). Additionally, the two or more lighting assemblies disposed in the common housing module may have any orientation relative to each other lighting assembly within the common housing module. For example, a first lighting assembly may emit outgoing light in a first, vertical direction, and a second lighting assembly may emit outgoing light in a direction that is angularly offset from the first, vertical direction.

In one or more embodiments, the lighting system 1400 may be referred to as a arrayed module including plural lighting assembly sub-modules that are aligned in an array. Each lighting assembly sub-module includes at least one laser diode controlled by a controller, and at least one lens element on a common substrate. Optionally, each lighting assembly may also include at least one photo diode electrically coupled with the controller. The lighting assembly sub-modules may be sorted, arranged, combined, and aligned to actively and/or passively form an array lighting system module. Lighting assembly sub-modules can be added or removed to the lighting system module to increase or decrease the size of the array. Additionally, lighting assembly sub-modules may be swapped or exchanged with a different lighting assembly sub-module for service, repair, replacement, or the like.

The lighting system 1400 includes a scanning unit 1410 that is in alignment with each of the lighting assemblies. The scanning unit 1410 receives a collimated beam or outgoing light 1408 from each of the lighting assemblies 1204. In the illustrated embodiment of FIG. 14, each of the lighting assemblies is arranged in an arc relative to the scanning unit 1410. For example, each of the lighting assemblies may concentric about the scanning unit 1410 relative to each other lighting assembly. Each lighting assembly 1204 emits the outgoing light 1408 from the lens array of each lighting assembly 1204 in a direction toward the scanning unit 1410. By positioning each of the lighting assemblies 1204 in an arc radiating from the scanning unit 1410 instead of in a substantially straight line (as illustrated in FIG. 2B), the lens array of each lighting assembly 1204 does not need to bend the light that is emitted from each laser diode and redirected toward the scanning unit 1410. For example, the collimated light beams from each lighting assembly 1204 are aligned and converge onto the scanning unit 1410. This arc of lasers may also be fashioned on a monolithic substrate with or without waveguides to help direct the beams to the mirror or scanning unit.

Figure 15:
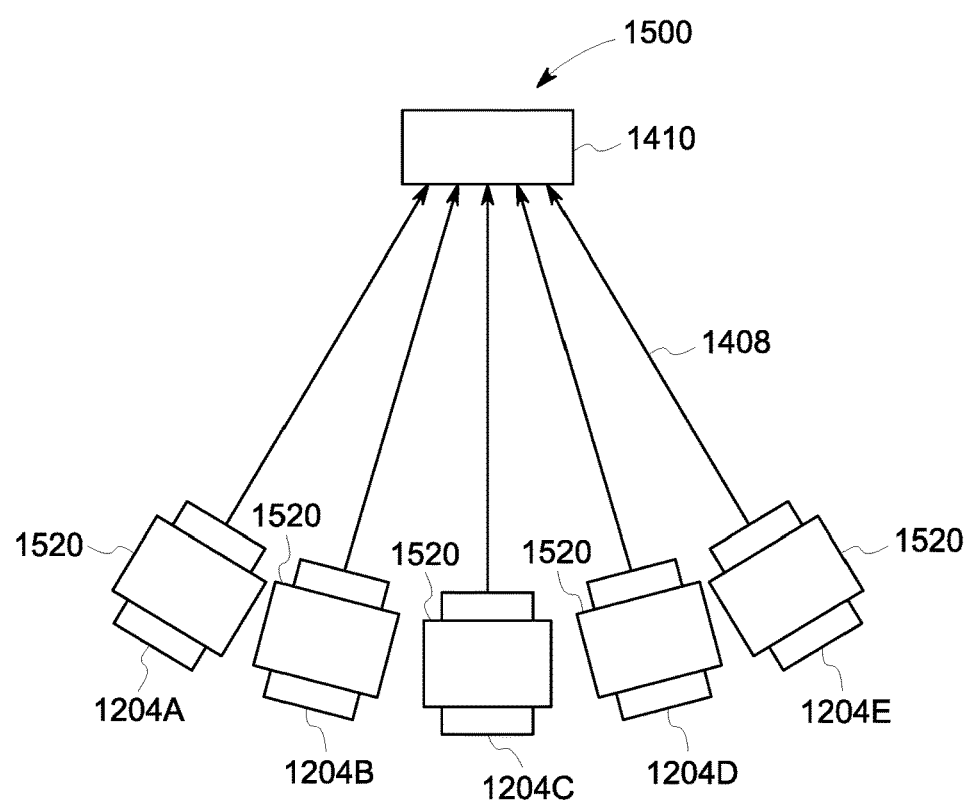
FIG. 15 illustrates a top view of another embodiment of a lighting system.

FIG. 15 illustrates a lighting system 1500 in accordance with another embodiment. Like the lighting system 1400 illustrated in FIG. 14, the lighting system 1500 includes plural lighting assemblies 1204A-E that are arranged in an arc about the scanning unit 1410. Each of the lighting assemblies 1204A-E also includes a power supply unit 1520 that is integrated with each lighting assembly 1204A-E and unitarily formed with each respective lighting assembly 1204. For example, the substrate 1220 of each lighting assembly 1204 may include one or more electrical connections that are unitarily formed with the lighting assembly that may be used to electrically connect the power supply unit 1520 with each lighting assembly 1204. The power supply unit 1520 may supply or provide power to one or more components of the lighting assembly 1204, such as each of the one or more laser diodes 1224, each of the one or more photo diodes 1226, each of the one or more controllers 1222, or any combination therein. The power supply unit 1520 may a component that is coupled with the one or more electrical connections of the substrate 1220, may be unitarily formed or embedded within the substrate 1220, may be separated from the lighting assembly 1204 but electrically coupled with each of the lighting assemblies 1204 via one or more wired or wireless connections, or the like. Optionally, the lighting system 1500 may include a single power supply unit 1520 that may be electrically coupled with each of the lighting assemblies 1204A-E to provide electrical power to each of the lighting assemblies 1204A-E.

Figure 16:
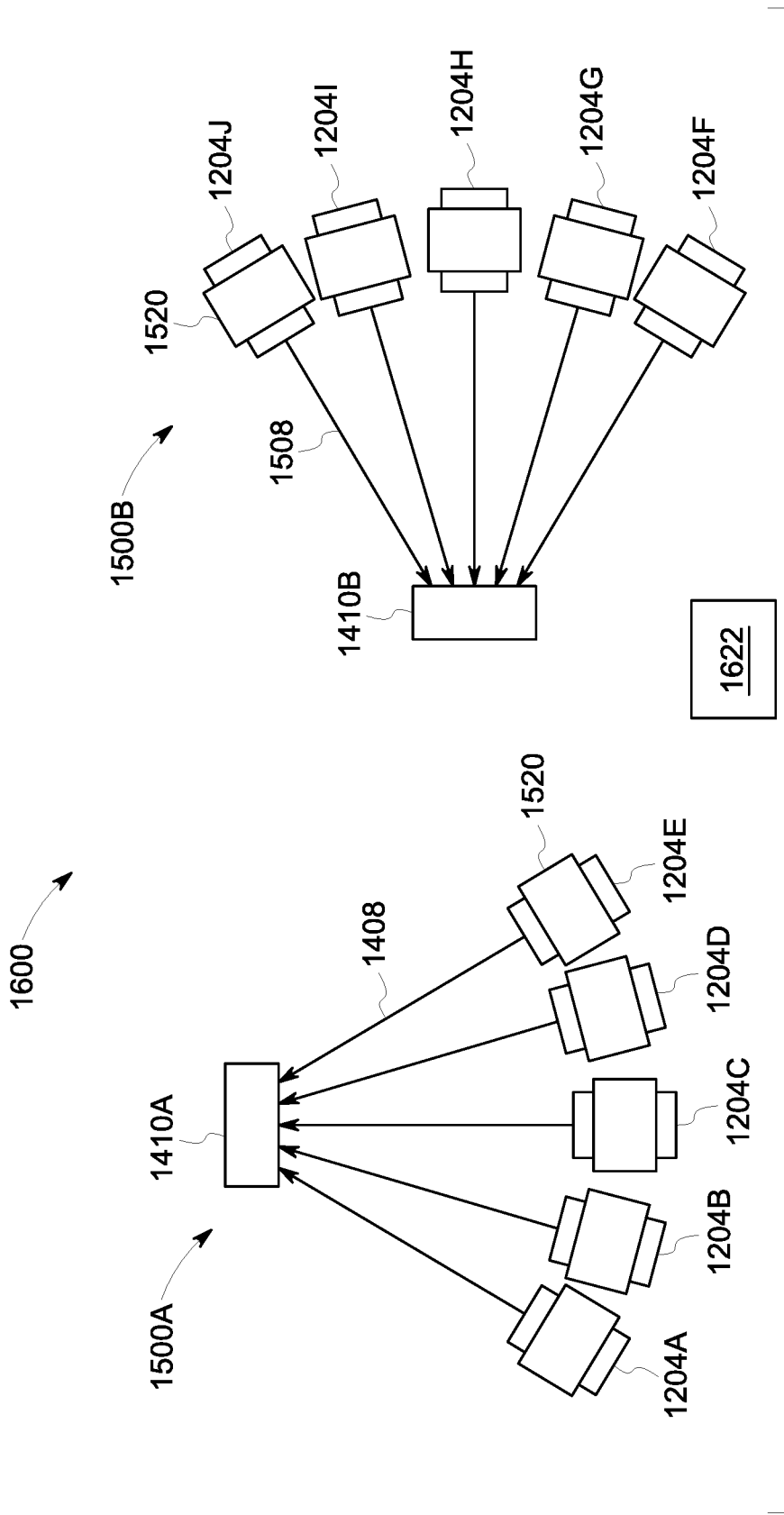
FIG. 16 illustrates a top view of a lighting system in accordance with another embodiment.

FIG. 16 illustrates a lighting system 1600 in accordance with one embodiment. The lighting system 1600 includes two lighting system modules 1500A, 1500B. The lighting module 1500A includes plural lighting assemblies 1204A-E that direct light toward a first scanning unit 1410A. For example, the first scanning unit 1410A receives the collimated beams 1408 from each of the lighting assemblies 1204A-E. The lighting module 1500B includes plural lighting assemblies 1204F-J that direct light toward a second scanning unit 1410B. For example, the second scanning unit 1410B receives collimated beams 1508 from each of the lighting assemblies 1204F-J. The lighting assemblies 1204A-E are arranged in an arc relative to the first scanning unit 1410A, and the lighting assemblies 1204F-J are arranged in an arc relative to the second scanning unit 1410B.

In the illustrated embodiment of FIG. 16, the first and second scanning units 1410A, 1410B have orientations that are substantially perpendicular to each other. Optionally, the first and second scanning units 1410A, 1410B may have any alternative orientation relative to each other scanning unit. For example, the first and second scanning units 1410A, 1410B may be substantially horizontally aligned with each other, may be angularly offset from each other, or any combination therein. The first and second scanning units 1410A, 1410B may scan the collimated beams in two different orthogonal directions. For example, the first scanning unit 1410A may scan collimated beams from the lighting assemblies 1204A-E in a first direction, and the second scanning unit 1410B may scan the collimated beams from the lighting assemblies 1204F-J in a different, orthogonal direction relative to the first scanning unit 1410A. Additionally, the lighting system modules 1500A, 1500B include a same number of lighting assemblies 1204A-E, 1204F-J directing collimated beams towards each respective scanning unit 1410A, 1410B. Optionally, the lighting system module 1500A may include more or fewer lighting assemblies 1204 than the lighting system module 1500B. Optionally, the lighting system 1600 may include more than two lighting system modules having any number of lighting assemblies.

In one or more embodiments, the lighting system 1600 may include a single scanning unit 1410 that may receive collimated beams from each of the different lighting assemblies 1204A-J.

Additionally, in the illustrated embodiment of FIG. 16, each of the lighting assemblies 1204A-J includes a laser power supply unit 1520. Optionally, a single laser power supply unit 1520 may provide power to each of the lighting assemblies 1204A-E of the lighting system module 1500A, and a second laser power supply unit may provide power to each of the lighting assemblies 1204F-J of the lighting system module 1500B. Optionally, a single laser power supply unit may provide power to each lighting system module 1500A, 1500B. Optionally, the lighting system 1600 may have any number of laser power supply units that may be electrically coupled with any number of lighting assemblies 1204.

In one or more embodiments, the lighting system 1600 may include a master controller 1622. The master controller 1622 may individually control operation of each of the lighting assemblies 1204A-J and may control operation of each of the scanning units 1410A, 1410B. For example, the master controller 1622 may control a power output or power level of each of the laser diodes of each lighting assembly 1204. Additionally or alternatively, the master controller 1622 may coordinate the collimated beams generated by the lighting system module 1500A and generated by the lighting system module 1500B.

Figure 17:
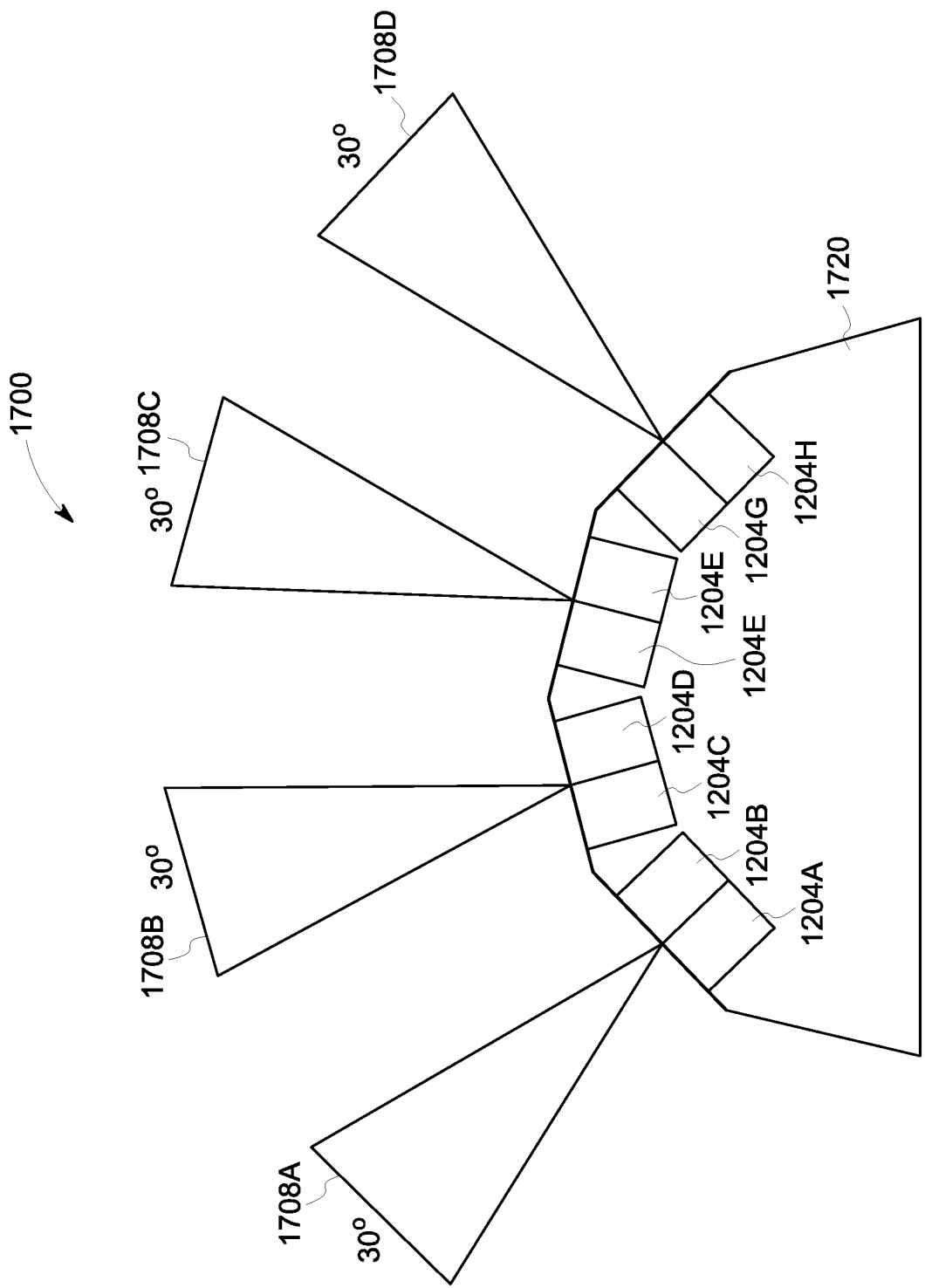
FIG. 17 illustrates a lighting system in accordance with another embodiment.

FIG. 17 illustrates a lighting system 1700 in accordance with one embodiment. The lighting system 1700 includes plural lighting assemblies 1204A-H that are arranged on a substrate 1720. In the embodiment of FIG. 16, each of the lighting system modules 1500A, 1500B can direct the collimated beams in two orthogonal directions that span about 15°. In order to increase the size of the collimated beams, two or more lighting assemblies may be arranged or oriented together to increase the size of the collimated beam from about 15° to about 30°. In the illustrated embodiment, the substrate 1720 has a dome-like structure such that each of the lighting assemblies 1204A-H may be oriented to direct light in different directions out and away from a surface of the substrate 1720. Optionally, the substrate 1720 may have any alternative shape and/or size. Additionally, the substrate 1720 may extend in a second dimension (e.g., into or out of the page) such that the lighting system 1700 may include plural lighting assemblies 1204 extending in two or more different directions (e.g., a four-by-four array of lighting assemblies). Additionally, the lighting system 1700 may include one or more cooling devices to control or manage a temperature of each of the lighting assemblies 1204.

Figure 18:
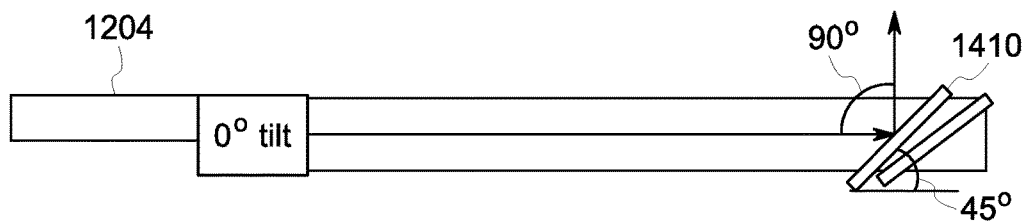
FIG. 18 illustrates one orientation of a lighting assembly relative to a scanning unit in accordance with one embodiment.
Figure 19:
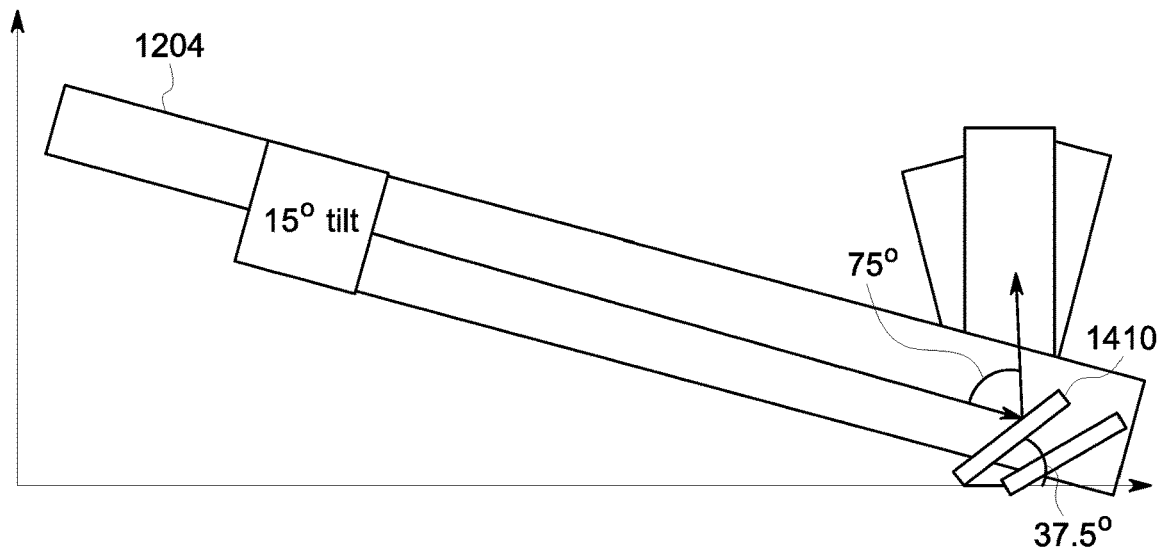
FIG. 19 illustrates another orientation of the lighting assembly relative to the scanning unit in accordance with one embodiment.
Figure 20:
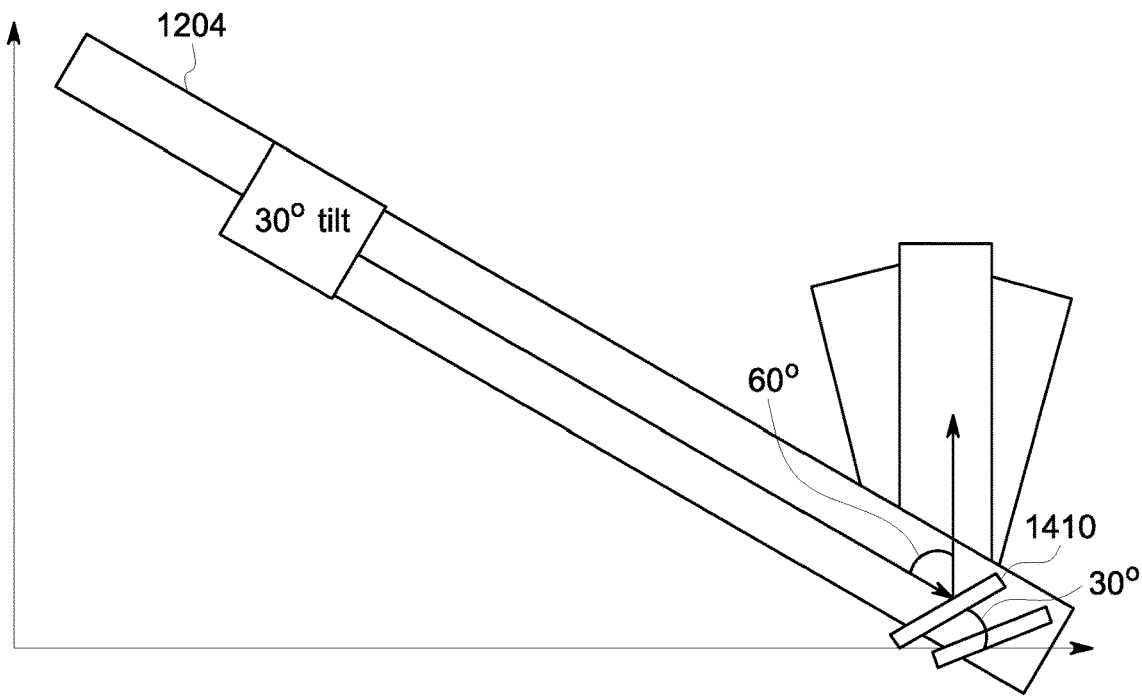
FIG. 20 illustrates another orientation of the lighting assembly relative to the scanning unit in accordance with one embodiment.
Figure 21:
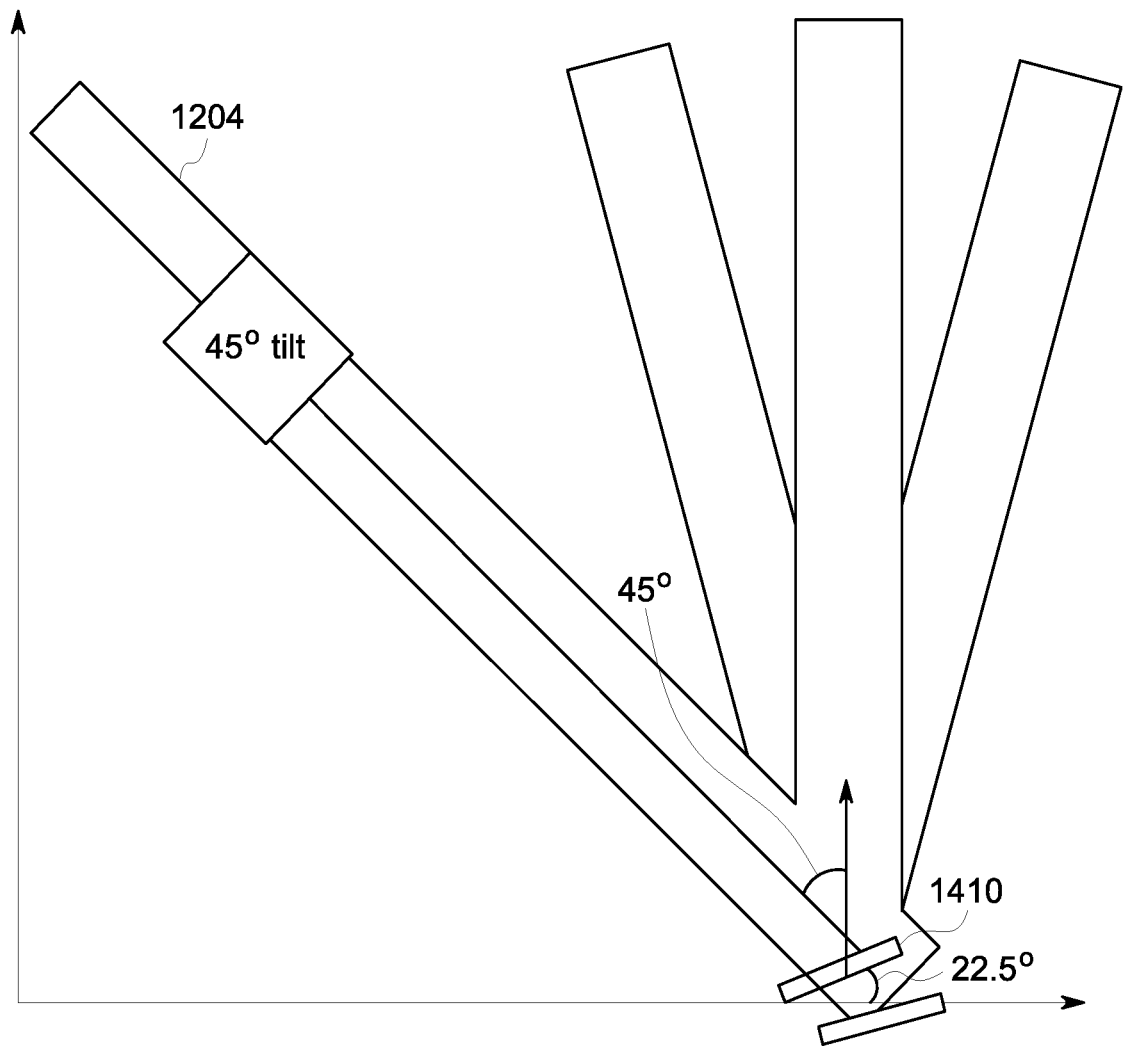
FIG. 21 illustrates another orientation of the lighting assembly relative to the scanning unit in accordance with one embodiment.

FIGS. 18 through 21 illustrate embodiments of laser diodes having different orientations relative to a lens element of the lens array. FIG. 18 illustrates one embodiment of orientating the lighting assembly 1204 at a substantially 0° tilt relative to the horizontal. The laser diode 1224 emits light in a direction toward the scanning unit 1410. The scanning unit 1410, such as a mirror, redirects the light received from the lighting assembly 1204 as outgoing light. The mirror may be about 11.5 mm wide. Alternatively, FIG. 19 illustrates one embodiment of orientating the lighting assembly 1204 at a substantially 15° tilt relative to the horizontal. Changing the tilt angle or orientation relative to the scanning unit 1410 allows for a smaller scanning unit 1410 (e.g., a smaller mirror of about 9.9 mm wide) to direct the outgoing light in a broader scanning area. Additionally, FIG. 20 illustrates another embodiment of orientating the lighting assembly 1204 at a substantially 30° tilt relative to the horizontal. Changing the tilt angle allows for an even smaller scanning unit 1410 (e.g., a smaller mirror about 8.8 mm wide) to direct the outing light toward an even more broad scanning area relative to the embodiment of FIG. 19. Additionally, FIG. 21 illustrates another embodiment of orientating the lighting assembly 1204 at a substantially 45° tilt relative to the horizontal. Changing the tilt angle allows for an even smaller scanning unit 1410 (e.g., a smaller mirror about 8.1 mm wide) to direct the outgoing light toward an even more broad scanning area relative to the embodiment of FIGS. 19 and 20. For example, changing the tilt angle of the lighting assembly 1204 allows the scanning unit 1410 to have a smaller size, reducing a weight and cost of the scanning unit 1410, and increases a scanning rate of the scanning unit 1410 relative to the lighting assembly 1204 having a 0° tilt relative to the horizontal.

In one or more embodiments, a method of manufacturing a lighting assembly may include forming or coupling a laser diode with a substrate, forming or coupling a lens array with the substrate, forming or coupling a controller with the substrate, and electrically coupling the controller with the laser diode. Optionally, a photo diode may be formed or coupled with the substrate and may be electrically coupled with the controller. The lighting assembly may be optically coupled with a scanning unit of a lighting system for a navigational system of a vehicle. The lighting assembly may be a first lighting assembly. The first lighting assembly and a different, second lighting assembly may be arranged in an arc relative to the scanning unit. Optionally, a cooling device, such as a heat-spreader, a vapor chamber heat sink, heat pipes, or the like, may be formed or coupled with the substrate. For example, the laser diode, the lens array, and the controller may be disposed on a first side or a first surface of the substrate, and the cooling device may be coupled with a different side or surface of the substrate, may be embedded within the substrate, or the like. The lighting assembly may be configured to operate according to one or more of the embodiments described herein. Additionally, the lighting assembly may be a first lighting assembly of plural different lighting assemblies of a lighting system that may operate, be arranged, be formed, or the like, according to one or more of the embodiments described herein.

In one or more embodiments of the subject matter described herein, a lighting system for a navigational system of a vehicle includes a scanning unit and one or more lighting assemblies. Each of the one or more lighting assemblies includes one or more laser diodes configured to emit light, a lens array including one or more lens elements, and a controller electrically coupled with each of the one or more laser diodes. The lens array is configured to receive incoming light from the one or more laser diodes and direct the incoming light from the lens array as a collimated beam. The controller is configured to individually control a power level of each of the one or more laser diodes. The one or more laser diodes, the lens array, and the controller are disposed on a substrate and disposed in a common housing. Each of the one or more lighting assemblies is arranged in an arc relative to the scanning unit. The scanning unit receives the collimated beam from each of the one or more lighting assemblies and directs the collimated beam from each of the one or more lighting assemblies in two orthogonal directions.

Optionally, two or more of the one or more lighting assemblies are disposed in a common housing module.

Optionally, each of the one or more lighting assemblies is disposed in an individual housing module.

Optionally, each of the one or more lighting assemblies includes a photo diode array having one or more photo diodes. A first laser diode is optically coupled with a first photo diode and electrically coupled with the controller, and a second laser diode is optically coupled with a second photo diode and electrically coupled with the controller.

Optionally, the lighting system also includes a cooling device coupled with the housing and configured to manage a temperature of each of the one or more lighting assemblies.

Optionally, the substrate includes a vapor chamber heatsink disposed inside the substrate. The vapor chamber heatsink is configured to control a temperature of the laser diode, the lens array, and the controller disposed on the substrate.

Optionally, each of the one or more lighting assemblies further comprised a heat-spreader integrated with the substrate.

Optionally, the laser diode, the lens array, and the controller are disposed on a first side of the substrate, and a heat-spreader is disposed on a second side of the substrate.

Optionally, the lighting system also includes an optical fiber operably coupled with at least one laser diode and the lens array, wherein the lens array is configured to receive incoming light from the at least one laser diode through the optical fiber.

Optionally, the lighting system also includes one or more grooves disposed within the housing. The optical fiber is disposed within the one or more grooves between the at least one laser diode and the lens array.

Optionally, the lighting system also includes a cooling device coupled with the one or more laser diodes. The cooling device is configured to manage a temperature of the one or more laser diodes.

Optionally, each of the one or more lighting assemblies also includes a laser diode array comprising two or more of the one or more laser diodes. Each of the two or more laser diodes of the laser diode array is configured to emit light toward the lens array.

Optionally, the controller is configured to control operation of each of the two or more laser diodes of the laser diode array.

Optionally, the controller is a first controller. The first controller is configured to control operation of a first laser diode of the laser diode array. A second controller is configured to control operation of a second laser diode of the laser diode array.

Optionally, the first laser diode is configured to operate at a first power setting, and the second laser diode is configured to operate at a different, second power setting.

Optionally, the lighting system also includes at least one laser power supply unit operably coupled with at least one of the one or more lighting assemblies.

Optionally, the scanning unit is a first scanning unit. The first scanning unit is configured to receive the collimated beam from at least one of the one or more lighting assemblies. A second scanning unit is configured to receive the collimated beam from another of the one or more lighting assemblies.

Optionally, the lighting system also includes a master controller configured to control operation of each of the one or more lighting assemblies.

Optionally, each of the one or more lighting assemblies is configured to be oriented at an angle relative to the scanning unit.

In one or more embodiments of the subject matter described herein, a lighting system includes a laser diode array including one or more laser diodes, a lens array including one or more lens elements, a controller electrically coupled with each of the one or more laser diodes of the laser array, and a cooling device configured to manage a temperature of the lighting assembly. The one or more laser diodes are configured to emit light. Each of the one or more laser diodes is optically connected to the one or more lens elements. The lens array is configured to receive incoming light from the one or more laser diodes. The lens array is configured to direct outgoing light as a collimated beam. The controller is configured to individually control a power level of each of the one or more laser diodes. The laser diode array, the lens array, and the controller are disposed on a first side of a substrate and disposed in a common housing. The cooling device is disposed on an alternative side of the substrate and in the common housing.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter set forth herein without departing from its scope. While the dimensions and types of materials described herein are intended to define the parameters of the disclosed subject matter, they are by no means limiting and are exemplary embodiments. Many other embodiments will be apparent to those of skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

As used herein, an element or step recited in the singular and proceeded with the word "a" or "an" should be understood as not excluding plural of said elements or steps, unless such exclusion is explicitly stated. Furthermore, references to "one embodiment" of the presently described subject matter are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

This written description uses examples to disclose several embodiments of the subject matter set forth herein, including the best mode, and also to enable a person of ordinary skill in the art to practice the embodiments of disclosed subject matter, including making and using the devices or systems and performing the methods. The patentable scope of the subject matter described herein is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, communication unit, control system, etc.) may be implemented in a single piece of hardware (for example, a general-purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

Since certain changes may be made in the above-described systems and methods, without departing from the spirit and scope of the inventive subject matter herein involved, it is intended that all of the subject matter of the above description or shown in the accompanying drawings shall be interpreted merely as examples illustrating the inventive concept herein and shall not be construed as limiting the inventive subject matter.

Changes can be made in the above constructions without departing from the scope of the disclosure, it is intended that all matter contained in the above description or shown in the accompanying drawings shall be interpreted as illustrative and not in a limiting sense.

What is claimed is:

1. A lighting system for a navigational system of a vehicle, comprising:
    a scanning unit comprising one or more oscillating mirrors; and
    one or more lighting assemblies, each of the one or more lighting assemblies comprising:
        one or more laser diodes configured to emit light;
        a lens array comprising one or more lens elements, the lens array configured to receive incoming light from the one or more laser diodes and direct the incoming light from the lens array as a collimated beam;
        a controller electrically coupled with each of the one or more laser diodes, the controller configured to individually control a power level of each of the one or more laser diodes; and
    wherein the one or more laser diodes, the lens array, and the controller are disposed on a substrate and disposed in a common housing, and
    wherein each of the one or more lighting assemblies is arranged in an arc relative to the scanning unit, wherein the scanning unit is configured to receive the collimated beam from each of the one or more lighting assemblies and direct the collimated beam from each of the one or more lighting assemblies in two orthogonal directions.

2. The lighting system of claim 1, wherein two or more of the one or more lighting assemblies are disposed in a common housing module.

3. The lighting system of claim 1, wherein each of the one or more lighting assemblies is disposed in an individual housing module.

4. The lighting system of claim 1, wherein each of the one or more lighting assemblies includes a photo diode array having one or more photo diodes, wherein a first laser diode is optically coupled with a first photo diode and electrically coupled with the controller, and wherein a second laser diode is optically coupled with a second photo diode and electrically coupled with the controller.

5. The lighting system of claim 1, further comprising a cooling device coupled with the housing and configured to manage a temperature of each of the one or more lighting assemblies.

6. The lighting system of claim 1, wherein the substrate includes a vapor chamber heatsink disposed inside the substrate, wherein the vapor chamber heatsink is configured to control a temperature of the laser diode, the lens array, and the controller disposed on the substrate.

7. The lighting system of claim 1, each of the one or more lighting assemblies further comprising a heat-spreader integrated with the substrate.

8. The lighting system of claim 1, wherein the laser diode, the lens array, and the controller are disposed on a first side of the substrate, and a heat-spreader is disposed on a second side of the substrate.

9. The lighting system of claim 1, further comprising an optical fiber operably coupled with at least one laser diode and the lens array, wherein the lens array is configured to receive incoming light from the at least one laser diode through the optical fiber.

10. The lighting system of claim 9, further comprising one or more grooves disposed within the housing, wherein the optical fiber is disposed within the one or more grooves between the at least one laser diode and the lens array.

11. The lighting system of claim 1, further comprising a cooling device coupled with the one or more laser diodes, wherein the cooling device is configured to manage a temperature of the one or more laser diodes.

12. The lighting system of claim 1, each of the one or more lighting assemblies further comprising a laser diode array comprising two or more of the one or more laser diodes, wherein each of the two or more laser diodes of the laser diode array is configured to emit light toward the lens array.

13. The lighting system of claim 12, wherein the controller is configured to control operation of each of the two or more laser diodes of the laser diode array.

14. The lighting system of claim 12, wherein the controller is a first controller, wherein the first controller is configured to control operation of a first laser diode of the laser diode array, and a second controller is configured to control operation of a second laser diode of the laser diode array.

15. The lighting system of claim 14, wherein the first laser diode is configured to operate at a first power setting, and wherein the second laser diode is configured to operate at a different, second power setting.

16. The lighting system of claim 1, further comprising at least one laser power supply unit operably coupled with at least one of the one or more lighting assemblies.

17. The lighting system of claim 1, wherein the scanning unit is a first scanning unit, wherein the first scanning unit is configured to receive the collimated beam from at least one of the one or more lighting assemblies, and wherein a second scanning unit is configured to receive the collimated beam from another of the one or more lighting assemblies.

18. The lighting system of claim 1, further comprising a master controller configured to control operation of each of the one or more lighting assemblies.

19. The lighting system of claim 1, wherein each of the one or more lighting assemblies is configured to be oriented at an angle relative to the scanning unit.

20. A lighting assembly comprising:
a laser diode array including one or more laser diodes, the one or more laser diodes configured to emit light;
a lens array comprising one or more lens elements, wherein each of the one or more laser diodes is optically connected to the one or more lens elements, the lens array configured to receive incoming light from the one or more laser diodes, the lens array configured to direct outgoing light as a collimated beam;
a controller electrically coupled with each of the one or more laser diodes of the laser array, the controller configured to individually control a power level of each of the one or more laser diodes; and
a cooling device configured to manage a temperature of the lighting assembly,
wherein the laser diode array, the lens array, and the controller are disposed on a first side of a substrate and disposed in a common housing,
wherein the cooling device is disposed on an alternative side of the substrate and in the common housing, and wherein the lens array is configured to direct the collimated beam toward a scanning unit comprising one or more oscillating mirrors, the scanning unit configured to receive the collimated beam from the lens array and direct the collimated beam from the lens array in two orthogonal directions.

* * * * *